United States Patent
Nagatomo

(10) Patent No.: US 12,519,454 B2
(45) Date of Patent: Jan. 6, 2026

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 18/379,895

(22) Filed: Oct. 13, 2023

(65) Prior Publication Data
US 2024/0039514 A1    Feb. 1, 2024

Related U.S. Application Data

(63) Continuation of application No. PCT/JP2022/016543, filed on Mar. 31, 2022.
(Continued)

(51) Int. Cl.
| | |
|---|---|
| H03H 9/205 | (2006.01) |
| H03H 9/02 | (2006.01) |
| H03H 9/56 | (2006.01) |

(52) U.S. Cl.
CPC ........ H03H 9/205 (2013.01); H03H 9/02015 (2013.01); H03H 9/568 (2013.01)

(58) Field of Classification Search
CPC .... H03H 9/205; H03H 9/02015; H03H 9/568; H03H 9/02157; H03H 9/587;
(Continued)

(56) References Cited

U.S. PATENT DOCUMENTS

| | | | |
|---|---|---|---|
| 8,294,330 B1 * | 10/2012 | Abbott | H03H 9/02834 |
| | | | 310/365 |
| 2005/0168102 A1 * | 8/2005 | Matsumoto | H03H 9/564 |
| | | | 310/312 |

(Continued)

FOREIGN PATENT DOCUMENTS

| | | |
|---|---|---|
| JP | 2007507960 A | 3/2007 |
| JP | 2019195166 A | 11/2019 |

(Continued)

OTHER PUBLICATIONS

International Search Report in PCT/JP2022/016543, mailed Jun. 21, 2022, 4 pages.
(Continued)

Primary Examiner — Jorge L Salazar, Jr.
(74) Attorney, Agent, or Firm — Keating & Bennett, LLP

(57) ABSTRACT

An acoustic wave device includes a first resonator, a first functional electrode provided on one of first and second main surfaces and a first dielectric film on the one of the first and second main surfaces, a second resonator sharing the piezoelectric layer with the first resonator and including a second functional electrode on one of the first and second main surfaces, a second dielectric film on the first main surface and a third dielectric film on the second main surface. The piezoelectric layer includes first and second resonator portions in which the first and second resonator are respectively provided. When thicknesses of the first resonator portion, the second resonator portion, the first dielectric film, the second dielectric film, and the third dielectric film are represented by tp1, tp2, ts1, ts2, and ts3, respectively, ts1/tp1<(ts2+ts3)/tp2 is satisfied.

19 Claims, 12 Drawing Sheets

Related U.S. Application Data

(60) Provisional application No. 63/175,844, filed on Apr. 16, 2021.

(58) Field of Classification Search
CPC .... H03H 9/588; H03H 9/564; H03H 9/02055; H03H 9/02228
USPC .................................. 333/186–188, 193–196
See application file for complete search history.

(56) References Cited

U.S. PATENT DOCUMENTS

| | | |
|---|---|---|
| 2008/0129414 A1 | 6/2008 | Lobl et al. |
| 2019/0341911 A1 | 11/2019 | Komatsu et al. |
| 2019/0386635 A1 | 12/2019 | Plesski et al. |
| 2019/0386642 A1 | 12/2019 | Komatsu |
| 2020/0321939 A1 | 10/2020 | Turner et al. |
| 2022/0216392 A1 | 7/2022 | Yamane et al. |

FOREIGN PATENT DOCUMENTS

| | | |
|---|---|---|
| JP | 2019216422 A | 12/2019 |
| JP | 2020182130 A | 11/2020 |
| WO | 2021060512 A1 | 4/2021 |

OTHER PUBLICATIONS

Written Opinion in PCT/JP2022/016543, mailed Jun. 21, 2022, 5 pages.

* cited by examiner

ACOUSTIC WAVE DEVICE

CROSS REFERENCE TO RELATED APPLICATIONS

This application claims the benefit of priority to Provisional Application No. 63/175,844 filed on Apr. 16, 2021 and is a Continuation Application of PCT Application No. PCT/JP2022/016543 filed on Mar. 31, 2022. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used in filters of mobile phones and the like in the past. In recent years, an acoustic wave device using a bulk wave in a thickness-shear mode has been proposed as described in U.S. Patent Application Publication No. 2019/0386635. In the acoustic wave device, a pair of electrodes is provided on a piezoelectric layer. The electrodes in a pair face each other on the piezoelectric layer and are connected to different electric potentials. By applying an AC voltage between the electrodes, a bulk wave in a thickness-shear mode is excited.

A frequency adjustment film may be provided on the piezoelectric layer so as to cover the electrodes. A frequency of an acoustic wave resonator may be adjusted by trimming the frequency adjustment film to adjust a thickness thereof. For example, when a thickness of the piezoelectric layer deviates from a target value due to a manufacturing error, the frequency may be adjusted to a desired frequency by adjusting a trimming amount of the frequency adjustment film.

When a plurality of acoustic wave resonators is formed in the piezoelectric layer, a desired frequency of each of the acoustic wave resonators is often different from each other. Therefore, thicknesses of the frequency adjustment films at the time of formation may be made different from each other between the plurality of acoustic wave resonators.

Here, in an acoustic wave resonator, the dependence of frequency deviation on the thickness of the frequency adjustment film may be different from the dependence of frequency deviation on the thickness of the piezoelectric layer. Thus, between a plurality of acoustic wave resonators, in a case that the thicknesses of the frequency adjustment films at the time of formation are different from each other, trimming amounts of the frequency adjustment films, when thicknesses of the piezoelectric layers deviate from the target values, are different from each other as well. Further, between the plurality of acoustic wave resonators, trimming amounts of the frequency adjustment films to be controlled, when the thicknesses of the piezoelectric layers deviate from the target values, are different from each other as well. That is, between the plurality of acoustic wave resonators, trimming amount differences, from the trimming amounts when the thicknesses of the piezoelectric layers are the target values, are different from each other as well.

In a case that a variation in the trimming amount differences of the frequency adjustment films in respective acoustic wave resonators is not considered, it is hard to reduce frequency variation in the plurality of acoustic wave resonators. Meanwhile, even when the trimming amount difference is taken into consideration, the error in the trimming amount increases in each acoustic wave resonator as the trimming amount difference is included. As a result, the frequency deviation is accumulated in each acoustic wave resonator, and it becomes hard to reduce the frequency variation in the plurality of acoustic wave resonators.

SUMMARY OF THE INVENTION

Preferred embodiments of the present invention provide acoustic wave devices each with reduced variation in trimming amount differences of frequency adjustment films between acoustic wave resonators and reduced frequency variation.

An acoustic wave device according to a preferred embodiment of the present invention includes a first resonator including a piezoelectric substrate including a piezoelectric layer including a first main surface and a second main surface opposed to each other, a first functional electrode on one of the first main surface and the second main surface, and a first dielectric film on the one of the first main surface and the second main surface on which the first functional electrode is provided, and a second resonator sharing the piezoelectric layer with the first resonator and including a second functional electrode on one of the first main surface and the second main surface, a second dielectric film on the first main surface, and a third dielectric film on the second main surface. The piezoelectric layer includes a first resonator portion in which the first resonator is provided and a second resonator portion in which the second resonator is provided, and when a thickness of the first resonator portion is represented by tp1, a thickness of the second resonator portion is represented by tp2, a thickness of the first dielectric film is represented by ts1, a thickness of the second dielectric film is represented by ts2, and a thickness of the third dielectric film is represented by ts3, $ts1/tp1 < (ts2+ts3)/tp2$ is satisfied.

According to preferred embodiments of the present invention, it is possible to provide acoustic wave devices each with reduced variation in trimming amount differences of frequency adjustment films between acoustic wave resonators and reduced frequency variation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The preferred embodiments described in the present description are merely examples, and partial replacement or combination of configurations is possible between different preferred embodiments.

Figure 1:
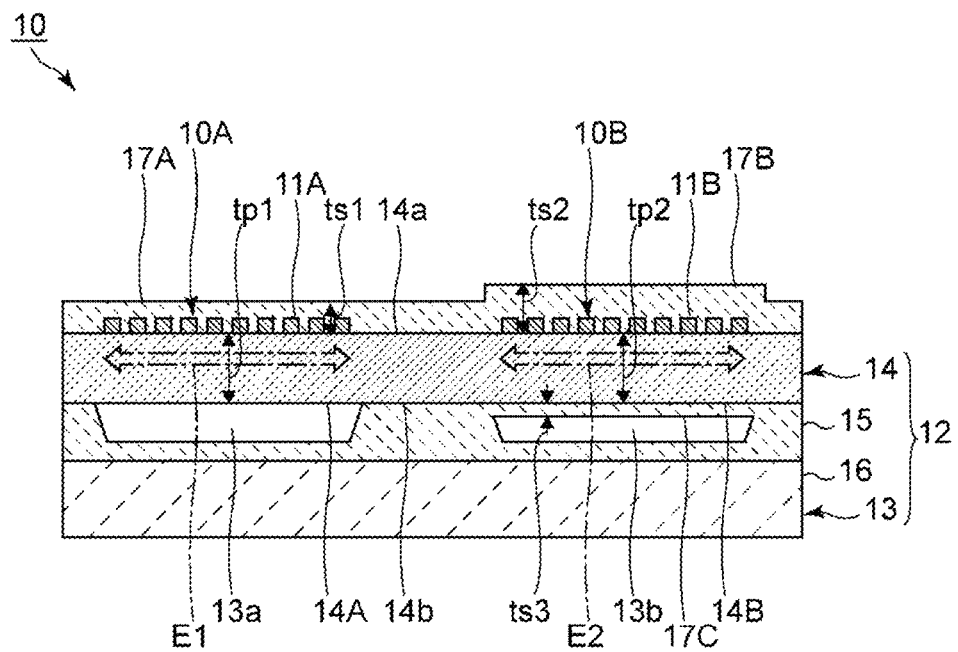
FIG. 1 is an elevational sectional view of an acoustic wave device according to a first preferred embodiment of the present invention.

FIG. 1 is an elevational sectional view of an acoustic wave device according to a first preferred embodiment of the present invention.

An acoustic wave device 10 includes a piezoelectric substrate 12. A first resonator 10A and a second resonator 10B are provided on the piezoelectric substrate 12. Each of the first resonator 10A and the second resonator 10B is an acoustic wave resonator. In the present preferred embodiment, each of the first resonator 10A and the second resonator 10B is configured to generate a bulk wave in a thickness-shear mode, such as a thickness-shear primary mode, for example.

The acoustic wave device 10 may be used as a portion of a filter device, for example. In the present preferred embodiment, a resonant frequency of the first resonator 10A is higher than a resonant frequency of the second resonator 10B. The first resonator 10A is a series-arm resonator. The second resonator 10B is a parallel-arm resonator. The number of resonators in the acoustic wave device 10 is not limited to two, and may be three or more. The acoustic wave device 10 itself may be a filter device, for example.

The piezoelectric substrate 12 includes a support member 13 and a piezoelectric layer 14. In the present preferred embodiment, the support member 13 includes a support substrate 16 and an insulation layer 15. The insulation layer 15 is provided on the support substrate 16. The piezoelectric layer 14 is provided on the insulation layer 15. The support member 13 may be defined only by the support substrate 16.

As a material of the support substrate 16, a semiconductor such as silicon, ceramics such as aluminum oxide, or the like may be used, for example. As a material of the insulation layer 15, an appropriate dielectric such as silicon oxide or tantalum pentoxide may be used, for example. In the present preferred embodiment, the piezoelectric layer 14 is a lithium niobate layer, for example. More specifically, the piezoelectric layer 14 is a Z-cut $LiNbO_3$ layer, for example. The piezoelectric layer 14 may be a lithium tantalate layer such as a $LiTaO_3$ layer, for example.

The support member 13 of the piezoelectric substrate 12 includes a cavity 13a and a cavity 13b. More specifically, the cavity 13a and the cavity 13b are each defined by a hollow portion provided in a portion of the insulation layer 15 in the piezoelectric substrate 12. The cavity 13a and the cavity 13b may be provided in the insulation layer 15 and the support substrate 16, or may be provided only in the support substrate 16. The cavity 13a and the cavity 13b each may be defined by a through-hole provided in the support member 13. At least one cavity needs to be provided in the support member 13.

The piezoelectric layer 14 includes a first main surface 14a and a second main surface 14b. The first main surface 14a and the second main surface 14b are opposed to each other. Of the first main surface 14a and the second main surface 14b, the second main surface 14b is positioned on a side of the support member 13. A first IDT electrode 11A is provided on the first main surface 14a. Thus, the first resonator 10A is provided. Further, a second IDT electrode 11B is provided on the first main surface 14a. Thus, the second resonator 10B is provided. As described above, the first resonator 10A and second resonator 10B share the piezoelectric layer 14.

Each of the first IDT electrode 11A and the second IDT electrode 11B includes a plurality of electrode fingers. In the present preferred embodiment, the first IDT electrode 11A is a first functional electrode. The second IDT electrode 11B is a second functional electrode. The electrode finger is the electrode.

The piezoelectric layer 14 includes a first resonator portion 14A and a second resonator portion 14B. Specifically, the first resonator portion 14A is a portion of the piezoelectric layer 14 on which the first resonator 10A is provided. More specifically, as indicated by an arrow E1 in FIG. 1, the first resonator portion 14A is a portion of the piezoelectric layer 14 on which the first IDT electrode 11A is provided. Meanwhile, the second resonator portion 14B is a portion of the piezoelectric layer 14 on which the second resonator 10B is provided. More specifically, as indicated by an arrow E2 in FIG. 1, the second resonator portion 14B is a portion of the piezoelectric layer 14 on which the second IDT electrode 11B is provided.

Here, in each of the first IDT electrode 11A and the second IDT electrode 11B, a direction in which adjacent electrode fingers face each other is referred to as an electrode finger facing direction. A range of the first resonator portion 14A in the electrode finger facing direction is a range from a portion of the first IDT electrode 11A on which the electrode finger at one end is provided to a portion of the first IDT electrode 11A on which the electrode finger at the other end is provided in the electrode finger facing direction. Similarly, a range of the second resonator portion 14B in the electrode finger facing direction is a range from a portion of the second IDT electrode 11B on which the electrode finger at one end is provided to a portion of the second IDT electrode 11B on which the electrode finger at the other end is provided in the electrode finger facing direction.

In plan view, at least a portion of the first IDT electrode 11A overlaps the cavity 13a. Meanwhile, in plan view, at least a portion of the second IDT electrode 11B overlaps the cavity 13b. The first IDT electrode 11A and the second IDT electrode 11B may overlap the same cavity in plan view. In the present description, a plan view refers to a view from a direction corresponding to an upper side in FIG. 1. In FIG. 1, of the support substrate 16 and the piezoelectric layer 14, a side of the piezoelectric layer 14 is the upper side, for example.

The first resonator 10A includes a first dielectric film 17A. The first dielectric film 17A is provided on the first main surface 14a of the piezoelectric layer 14 so as to cover the first IDT electrode 11A. The second resonator 10B includes a second dielectric film 17B and a third dielectric film 17C. The second dielectric film 17B is provided on the first main surface 14a of the piezoelectric layer 14 so as to cover the second IDT electrode 11B.

In the present preferred embodiment, the first dielectric film 17A and the second dielectric film 17B are integrally provided. More specifically, a dielectric film is provided so as to cover the first IDT electrode 11A and the second IDT electrode 11B. A portion of the dielectric film that overlaps the first resonator portion 14A of the piezoelectric layer 14 in plan view is the first dielectric film 17A. A portion of the dielectric film that overlaps the second resonator portion 14B in plan view is the second dielectric film 17B. The first dielectric film 17A and the second dielectric film 17B may be provided as independent bodies.

The third dielectric film 17C is provided on the second main surface 14b of the piezoelectric layer 14 so as to overlap the second IDT electrode 11B in plan view. Thus, the third dielectric film 17C is provided at a portion of the second main surface 14b in which the second resonator portion 14B is positioned. More specifically, the third dielectric film 17C is positioned in the cavity 13b. In the present preferred embodiment, the third dielectric film 17C is provided integrally with the insulation layer 15. The third dielectric film 17C may be provided as an independent body from the insulation layer 15.

The first dielectric film 17A, the second dielectric film 17B, and the third dielectric film 17C are each a frequency adjustment film. The frequency of the first resonator 10A may be adjusted by trimming the first dielectric film 17A to adjust a thickness of the first dielectric film 17A. Similarly, the frequency of the second resonator 10B may be adjusted by trimming the second dielectric film 17B to adjust the sum of thicknesses of the second dielectric film 17B and the third dielectric film 17C. Hereinafter, the first dielectric film 17A, the second dielectric film 17B, and the third dielectric film 17C may collectively be described as a frequency adjustment film.

In the present preferred embodiment, each of the first dielectric film 17A, the second dielectric film 17B, and the third dielectric film 17C is made of silicon oxide, for example. More specifically, each of the dielectric films above is made of $SiO_2$, for example. The material of each of the first dielectric film 17A, the second dielectric film 17B, and the third dielectric film 17C is not limited to the above, and silicon nitride or the like may be used as well, for example. In the present description, an expression that a certain member is made of a certain material includes a case that a trace of impurities is included to the extent that an acoustic wave device has no significant deterioration in electrical characteristics.

Hereinafter, thicknesses of the piezoelectric layer 14 in the first resonator portion 14A and in the second resonator portion 14B are represented by tp1 and tp2, respectively. The thicknesses tp1 and tp2 are collectively represented by a thickness tp of the resonator portion. The thicknesses of the first dielectric film 17A, the second dielectric film 17B, and the third dielectric film 17C are represented by ts1, ts2, and ts3, respectively. The thicknesses ts1, ts2, and ts3 are collectively represented by a thickness ts of the dielectric film. A deviation amount of the thickness of the piezoelectric layer 14 is represented by $\Delta tp$, and a trimming amount difference of the first dielectric film 17A, the second dielectric film 17B, or the third dielectric film 17C is represented by $\Delta ts$.

In the present preferred embodiment, the first dielectric film 17A and the second dielectric film 17B are each trimmed in a frequency adjustment. The deviation amount $\Delta tp$, specifically, is a deviation amount from a thickness target value of the piezoelectric layer 14. The trimming amount difference $\Delta ts$, specifically, is a difference between the trimming amount when the thickness of the piezoelectric layer 14 is the target value and the trimming amount when the thickness of the piezoelectric layer 14 is deviated from the target value. A ratio of the trimming amount difference $\Delta ts$ to the deviation amount $\Delta tp$ is represented by $\Delta ts/\Delta tp$.

In the present preferred embodiment, the thickness ts1 of the first dielectric film 17A is defined as a distance between the first main surface 14a of the piezoelectric layer 14 and a surface of the first dielectric film 17A in a portion where the first IDT electrode 11A is not provided. The thickness ts2 of the second dielectric film 17B is defined as a distance between the first main surface 14a of the piezoelectric layer 14 and a surface of the second dielectric film 17B in a portion where the second IDT electrode 11B is not provided. The thickness ts3 of the third dielectric film 17C is a distance between the second main surface 14b of the piezoelectric layer 14 and a surface of the third dielectric film 17C. The thickness ts3 may be the distance above in a portion overlapping the second IDT electrode 11B in plan view.

In the present preferred embodiment, the first resonator includes the first dielectric film 17A, the second resonator includes both of the second dielectric film 17B and the third dielectric film 17C, and ts1/tp1<(ts2+ts3)/tp2 is satisfied. As a result, variation in the trimming amount differences Δts of the frequency adjustment films between the first resonator 10A and the second resonator 10B may be reduced, and thus frequency variation may be reduced. This will be described in more detail below.

In the present preferred embodiment, the resonant frequencies of the first resonator 10A and the second resonator 10B are different from each other. Therefore, the thicknesses of the frequency adjustment films at the time of formation in the first resonator 10A and in the second resonator 10B are different from each other as well. Accordingly, in a case that the acoustic wave device 10 has a configuration according to the related art, the trimming amount differences Δts, required when the thickness of the piezoelectric layer 14 deviates from the target value, are different from each other between the first resonator 10A and the second resonator 10B. That is, between the acoustic wave resonators above, the ratios Δts/Δtp become different from each other, in which Δts is the trimming amount difference and Δtp is the deviation amount from the thickness target value of the piezoelectric layer 14. In the case above, as described before, the trimming amounts required for acoustic wave resonators include the trimming amount differences Δts different from each other. This increases the frequency deviation in each acoustic wave resonator due to an error or the like.

In contrast, the inventor of preferred embodiments of the present invention has discovered that when ts1/tp1<(ts2+ts3)/tp2 is satisfied, between the acoustic wave resonators above, the ratios Δts/Δtp may be made close to each other, and the trimming amount differences Δts may be made close to each other.

Figure 2:
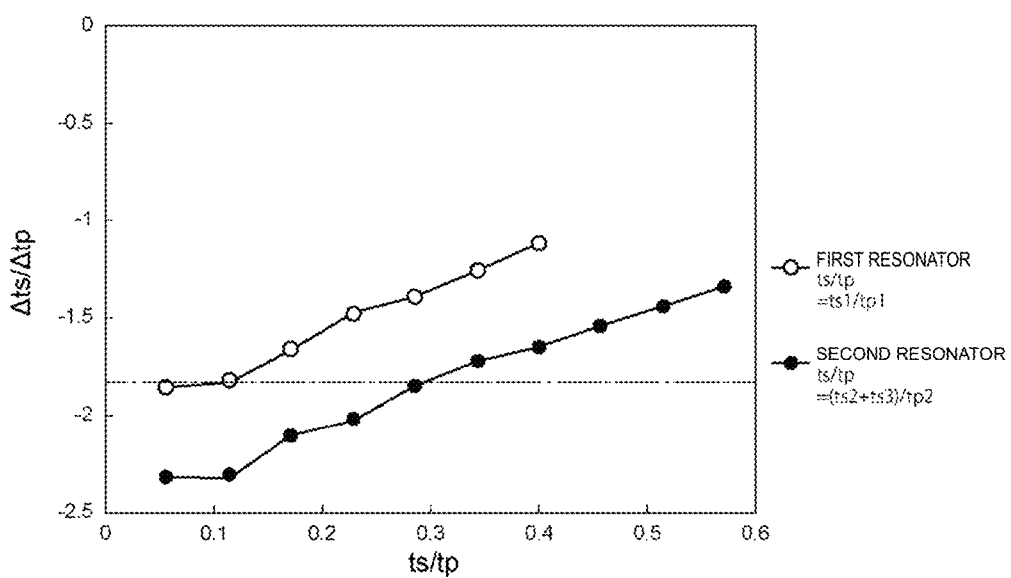
FIG. 2 is a graph illustrating a relationship between a ratio ts/tp and a ratio $\Delta ts/\Delta tp$ in a first resonator and in a second resonator in the first preferred embodiment of the present invention.

FIG. 2 is a graph illustrating a relationship between the ratio ts/tp and the ratio Δts/Δtp in the first resonator and in the second resonator in the first preferred embodiment.

As illustrated in FIG. 2, relationships between the ratio ts/tp and the ratio Δts/Δtp are different from each other between the first resonator 10A and the second resonator 10B. From an example indicated by a dashed-and-dotted line in FIG. 2, the ratio Δts/Δtp in the first resonator 10A and the ratio Δts/Δtp in the second resonator 10B may become equal or substantially equal to each other. By making the ratio ts/tp in the second resonator greater than the ratio ts/tp in the first resonator 10A, the ratios Δts/Δtp of both may be made equal or substantially equal to each other.

As described above, the frequency adjustment film of the first resonator 10A is the first dielectric film 17A. In the first resonator 10A, the thickness ts is ts1 and the thickness tp is tp1. The frequency adjustment film of the second resonator 10B is the second dielectric film 17B and the third dielectric film 17C. In the second resonator 10B, the thickness ts is ts2+ts3, and the thickness tp is tp2. Accordingly, by satisfying ts1/tp1<(ts2+ts3)/tp2, the ratios Δts/Δtp of both may be made equal or substantially equal to each other.

The reason why the relationships between the ratio ts/tp and the ratio Δts/Δtp are different between the first resonator and the second resonator 10B is that the positions where the frequency adjustment films are provided are different from each other. Specifically, the frequency adjustment film of the first resonator 10A is provided on one main surface of the piezoelectric layer 14. Meanwhile, the frequency adjustment films of the second resonator 10B are provided on both main surfaces of the piezoelectric layer 14.

The first resonator 10A and the second resonator 10B share the piezoelectric layer 14. In the present preferred embodiment, a thickness of the piezoelectric layer 14 in the first resonator portion 14A and in the second resonator portion 14B are the same or substantially the same, and tp1=tp2 is satisfied. Between the resonator portions described above, the deviation amounts Δtp in the thickness of the piezoelectric layer 14 are equal or substantially equal to each other as well. In the case above, by satisfying ts1/tp1<(ts2+ts3)/tp2 and making the ratios Δts/Δtp of both be equal or substantially equal to each other, the trimming amount differences Δts of both may be made equal or substantially equal to each other as well. Thus, accumulation of errors in the trimming amount of the frequency adjustment film in each of the first resonator 10A and the second resonator 10B may be reduced. Therefore, the frequency deviation in each acoustic wave resonator may be reduced. Accordingly, the frequency variation in the acoustic wave device 10 as a whole may be reduced.

It is preferable to simultaneously trim the frequency adjustment films in the first resonator 10A and in the second resonator 10B. As a result, error accumulation with each trimming may be reduced, and frequency deviation in each acoustic wave resonator may effectively be reduced. Accordingly, the frequency variation in the acoustic wave device 10 as a whole may effectively be reduced.

In the acoustic wave device 10, the second dielectric film 17B and the third dielectric film 17C are made of the same type of dielectric. In the case above, a relationship between the thickness ts2 of the second dielectric film 17B and the thickness ts3 of the third dielectric film 17C preferably satisfies about 0.8×ts2≤ts3≤1.25×ts2. More preferably, ts2=ts3 is satisfied. As a result, the relationships between the ratio ts/tp and the ratio Δts/Δtp in the first resonator 10A and in the second resonator 10B may more reliably be made different from each other as illustrated in FIG. 2. Therefore, the ratios Δts/Δtp may more reliably be made equal or substantially equal to each other between the acoustic wave resonators above.

In the first preferred embodiment, the ratios Δts/Δtp may be made equal or substantially equal to each other between the first resonator 10A and the second resonator 10B. Note that, the ratios Δts/Δtp need not be completely equal to each other between the acoustic wave resonators above. An example of this is illustrated below. In this example, the thicknesses tp of the piezoelectric layer 14 in the first resonator portion 14A and in the second resonator portion 14B, and the thicknesses ts of the first dielectric film 17A, the second dielectric film 17B, and the third dielectric film 17C are as follows. As described above, the piezoelectric layer 14 is made of a Z-cut $LiNbO_3$. Each of the first dielectric film 17A, the second dielectric film 17B, and the third dielectric film 17C is made of $SiO_2$.

Figure 3:
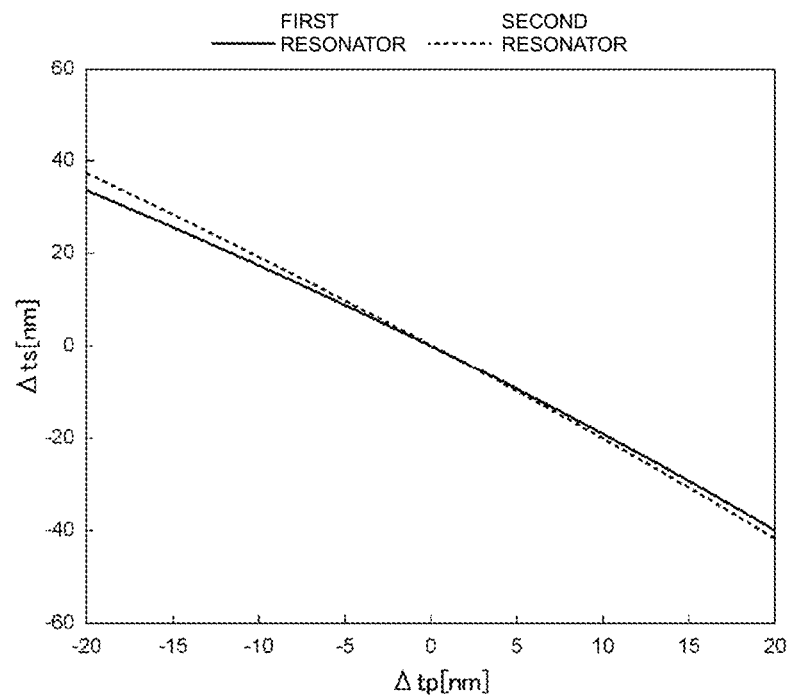
FIG. 3 is a graph illustrating an example of a relationship between $\Delta tp$ and $\Delta ts$ in the first dielectric film and in the second dielectric film in the first preferred embodiment of the present invention, in which $\Delta tp$ is a deviation amount in the thickness of the piezoelectric layer and $\Delta ts$ is a trimming amount difference.

Thickness tp1 of first resonator portion: about 370 nm
Thickness tp2 of second resonator portion: about 370 nm
Thickness ts1 of first dielectric film: about 48 nm
Thickness ts2 of second dielectric film: about 48 nm
Thickness ts3 of third dielectric film: about 110 nm FIG. 3 is a graph illustrating an example of a relationship between Δtp and Δts in the first dielectric film and in the second dielectric film in the first preferred embodiment, in which Δtp is the deviation amount in the thickness of the piezoelectric layer and Δts is the trimming amount difference.

In the example illustrated in FIG. 3, the ratios Δts/Δtp are not completely equal to each other between the first resonator 10A and the second resonator 10B. In the case above as well, when Δtp is within about ±10 nm, for example, a difference in the trimming amount differences Δts between the first resonator 10A and the second resonator 10B is about 1 nm or less. As described above, in a case that the trimming amount differences Δts may be made close to each other, when the trimming amounts themselves are close to each other as well, it is preferable that the frequency adjustment films in the first resonator 10A and in the second resonator 10B be trimmed at the same time.

Similar to the thicknesses of the piezoelectric layer 14 in respective resonator portions and the thicknesses of respective dielectric films in the example illustrated in FIG. 3, the relationship between the thicknesses preferably satisfies about 1.3×(ts1/tp1)<(ts2+ts3)/tp2. As a result, the trimming amount differences Δts in the first resonator 10A and in the second resonator 10B may more reliably be brought close to each other.

As a comparative example, there will be described an example in which the ratios Δts/Δtp are greatly different between acoustic wave resonators. The comparative example is different from the first preferred embodiment in that the frequency adjustment film of the second resonator is only the second dielectric film. In the comparative example, the third dielectric film is not provided on the second main surface of the piezoelectric layer.

Figure 4:
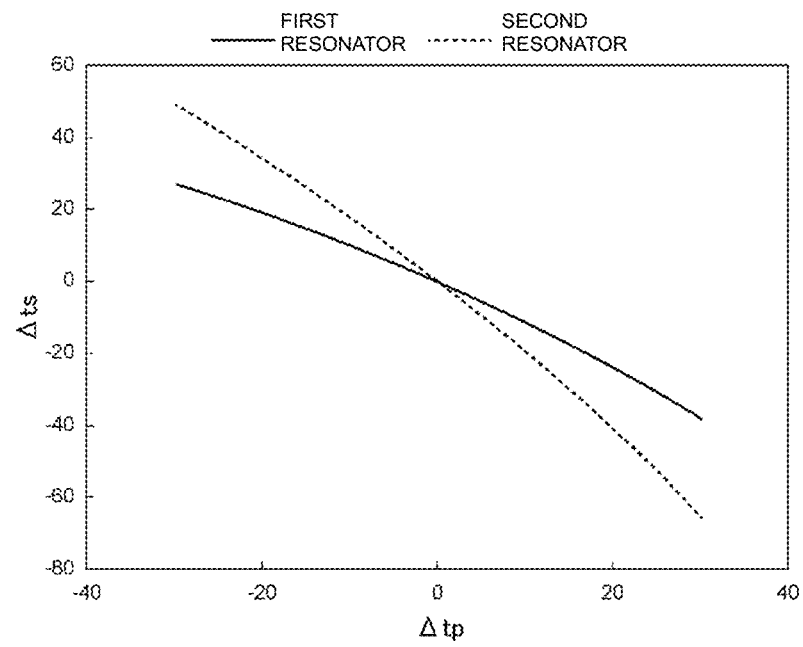
FIG. 4 is a graph illustrating a relationship between $\Delta tp$ and $\Delta ts$ in a first dielectric film and in a second dielectric film in a comparative example, in which $\Delta tp$ is the deviation amount in the thickness of the piezoelectric layer and Δts is the trimming amount difference.

Thickness tp1 of first resonator portion: about 373 nm
Thickness tp2 of second resonator portion: about 373 nm
Thickness ts1 of first dielectric film: about 43 nm
Thickness ts2 of second dielectric film: about 133 nm FIG. 4 is a graph illustrating relationships between Δtp and Δts in a first dielectric film and in a second dielectric film in the comparative example, in which Δtp is the deviation amount of the thickness of the piezoelectric layer and Δts is the trimming amount difference.

As illustrated in FIG. 4, in the comparative example, the ratios Δts/Δtp are greatly different between the first resonator and the second resonator. Specifically, the ratio Δts/Δtp in the first resonator is about −1.08, and the ratio Δts/Δtp in the second resonator is about −1.79.

In the first resonator and the second resonator of the comparative example, desired frequencies are different from each other, and thus, thicknesses of the first dielectric film and the second dielectric film at the time of forming are different from each other. Accordingly, as described above, the trimming amount differences Δts, when the thickness of the piezoelectric layer 14 deviates from the target value, are greatly different from each other. Therefore, in the comparative example, when the frequency adjustment films of the first resonator and the second resonator are trimmed at the same time, deviation from a desired frequency may become great in the first resonator or in the second resonator. Meanwhile, independently trimming each acoustic wave resonator may result in trimming errors accumulating.

In contrast, in the first preferred embodiment, as described above, the trimming amount differences Δts in the first resonator 10A and in the second resonator 10B may be made close to each other. As a result, the frequency variation in the acoustic wave device 10 as a whole may be reduced.

As illustrated in FIG. 1, in the first preferred embodiment, no dielectric film is provided on a portion of the second main surface 14b of the piezoelectric layer 14 where the first resonator portion 14A is positioned. However, a dielectric film having a small thickness may be provided to the extent that the acoustic wave device 10 is not greatly affected in the electrical characteristics.

The support member 13 is not mandatory in the acoustic wave device 10. The first resonator 10A and the second resonator 10B need to be capable of using a bulk wave in a thickness-shear mode or the like.

As described above, in the acoustic wave device 10, the second dielectric film 17B and the third dielectric film 17C are made of the same type of dielectric. However, the second dielectric film 17B and the third dielectric film 17C may be made of different types of dielectrics.

Figure 5:
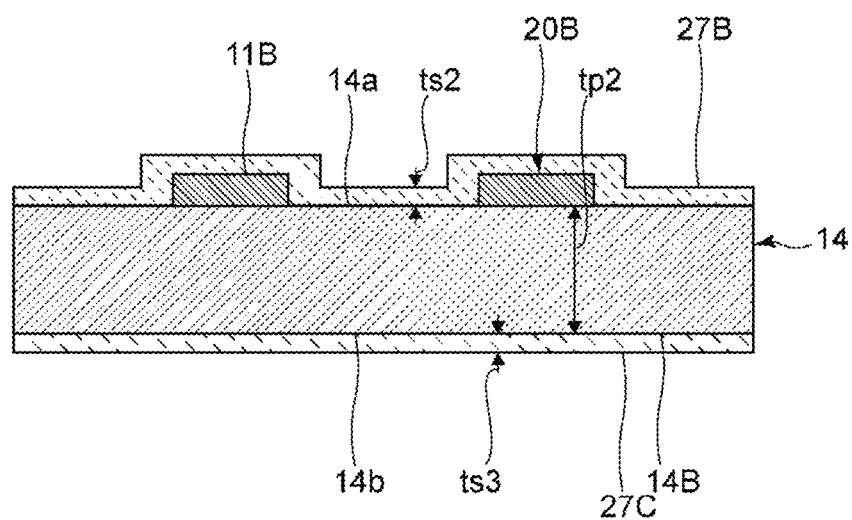
FIG. 5 is a schematic elevational sectional view of a second resonator according to a second preferred embodiment of the present invention illustrating the vicinity of one pair of electrode fingers.

FIG. 5 is a schematic elevational sectional view of a second resonator according to a second preferred embodiment of the present invention illustrating the vicinity of one pair of electrode fingers.

The present preferred embodiment is different from the first preferred embodiment in that, in a second resonator 20B, a second dielectric film 27B and a third dielectric film 27C are made of different types of dielectrics. Except for the point above, the acoustic wave device of the present preferred embodiment has the same or substantially the same configuration as that of the acoustic wave device 10 of the first preferred embodiment. Reference characters of elements in the first preferred embodiment illustrated in FIG. 1 are used for elements in the present preferred embodiment, other than reference signs of elements of the second resonator 20B.

In the present preferred embodiment as well, as in the first preferred embodiment, ts1/tp1<(ts2+ts3)/tp2 is satisfied. As a result, variation in the trimming amount differences Δts of the frequency adjustment films between the first resonator 10A and the second resonator 20B may be reduced, and thus the frequency variation may be reduced.

As described above, when the second dielectric film 27B and the third dielectric film 27C are made of the same type of dielectric, a state that thicknesses of the second dielectric film 27B and the third dielectric film 27C are the same or substantially the same is a preferable state. More specifically, the preferable state above is a state in which the mass per unit area of the second dielectric film 27B and the mass per unit area of the third dielectric film 27C are the same or substantially the same. In the present preferred embodiment, the thicknesses of the second dielectric film 27B and the third dielectric film 27C are adjusted depending on density. Thus, the mass per unit area of the second dielectric film 27B and the mass per unit area of the third dielectric film 27C may be made close to each other.

Of the second dielectric film 27B and the third dielectric film 27C, the thickness of one dielectric film having a higher density is preferably smaller than the thickness of the other dielectric film having a lower density. As a result, the mass per unit area of the second dielectric film 27B and the mass per unit area of the third dielectric film 27C may be easily made the same or substantially the same. The thicknesses of the second dielectric film 27B and the third dielectric film 27C may be adjusted depending on acoustic impedance.

In the present preferred embodiment, the first dielectric film 17A of the first resonator 10A and the second dielectric film 27B of the second resonator 20B are made of the same type of dielectric. However, the first dielectric film 17A and the second dielectric film 27B may be made of different types of dielectrics.

Figure 6:
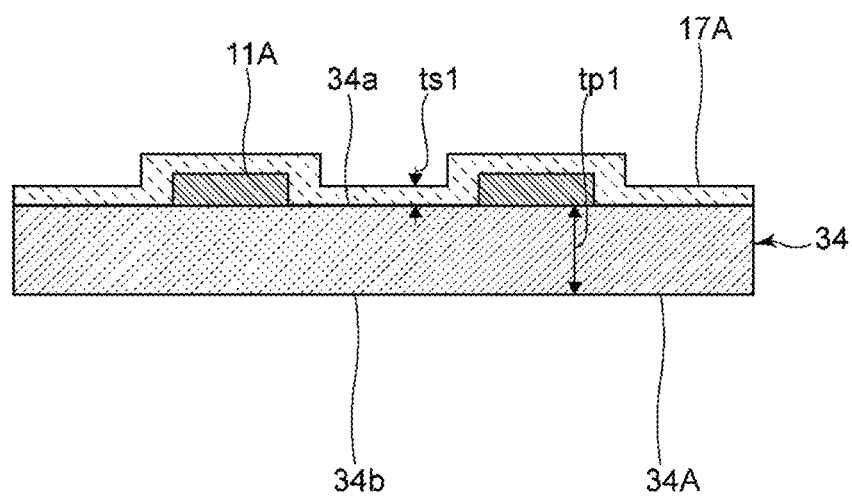
FIG. 6 is a schematic elevational sectional view of a first resonator according to a third preferred embodiment of the present invention illustrating the vicinity of one pair of electrode fingers.
Figure 7:
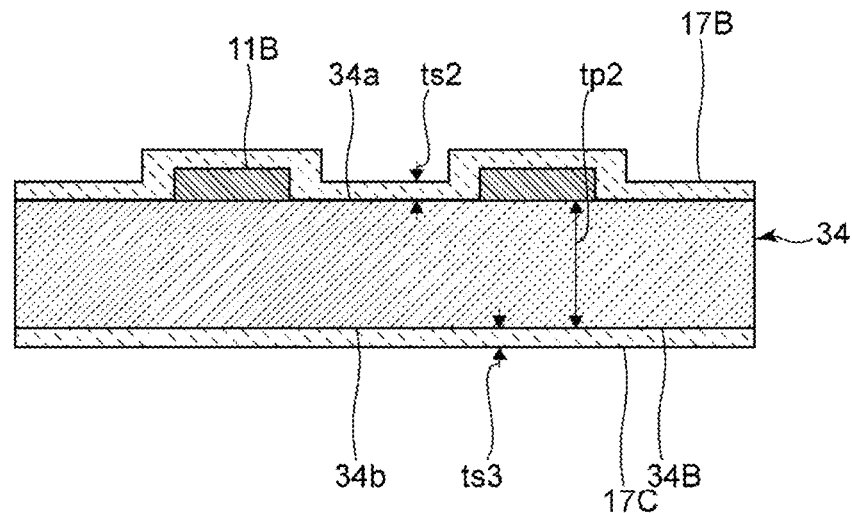
FIG. 7 is a schematic elevational sectional view of a second resonator according to the third preferred embodiment of the present invention illustrating the vicinity of one pair of electrode fingers.

FIG. 6 is a schematic elevational sectional view of a first resonator according to a third preferred embodiment of the present invention illustrating the vicinity of one pair of electrode fingers. FIG. 7 is a schematic elevational sectional view of a second resonator according to the third preferred embodiment of the present invention illustrating the vicinity of one pair of electrode fingers.

As illustrated in FIG. 6 and FIG. 7, the present preferred embodiment is different from the first preferred embodiment in that tp1≠tp2 is satisfied. Except for the point above, the acoustic wave device of the present preferred embodiment has the same or substantially the same configuration as that of the acoustic wave device 10 of the first preferred embodiment.

Although not illustrated, in the present preferred embodiment, providing a step portion in a piezoelectric layer 34 makes the thickness tp1 of a first resonator portion 34A and the thickness tp2 of a second resonator portion 34B be different from each other. The step portion needs to be provided on at least one of a side of a first main surface 34a and a side of a second main surface 34b.

In the present preferred embodiment as well, $ts1/tp1<(ts2+ts3)/tp2$ is satisfied. Accordingly, variation in the trimming amount differences $\Delta tp$ of the frequency adjustment films between the acoustic wave resonators may be reduced, and thus the frequency variation may be reduced.

Figure 8:
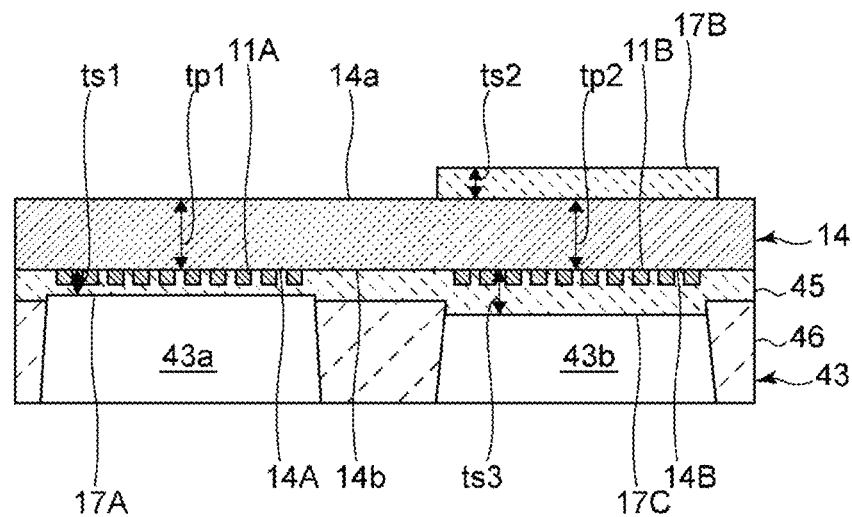
FIG. 8 is an elevational sectional view of an acoustic wave device according to a fourth preferred embodiment of the present invention.

FIG. 8 is an elevational sectional view of an acoustic wave device according to a fourth preferred embodiment of the present invention.

The present preferred embodiment is different from the first preferred embodiment in that the first IDT electrode 11A, the second IDT electrode 11B, and the first dielectric film 17A are provided on the second main surface 14b of the piezoelectric layer 14. The present preferred embodiment is also different from the first preferred embodiment in that the third dielectric film 17C covers the second IDT electrode 11B and the second dielectric film 17B does not cover the second IDT electrode 11B. Further, the present preferred embodiment is different from the first preferred embodiment in the configuration of a support member 43. Except for the point above, the acoustic wave device of the present preferred embodiment has the same or substantially the same configuration as that of the acoustic wave device 10 of the first preferred embodiment.

The support member 43 includes a support substrate 46 and an insulation layer 45. Two through-holes are provided in the support substrate 46. The insulation layer 45 is provided on the support substrate 46 so as to close the two through-holes. Thus, a cavity 43a and a cavity 43b are provided. The piezoelectric layer 14 is provided on the insulation layer 45.

The first dielectric film 17A and the third dielectric film 17C are provided integrally with the insulation layer 45. In the present preferred embodiment, the thickness ts1 of the first dielectric film 17A is defined as a distance between the second main surface 14b of the piezoelectric layer 14 and the surface of the first dielectric film 17A in a portion where the first IDT electrode 11A is not provided. The thickness ts2 of the second dielectric film 17B is defined as a distance between the first main surface 14a of the piezoelectric layer 14 and the surface of the second dielectric film 17B. The thickness ts3 of the third dielectric film 17C is defined as a distance between the second main surface 14b of the piezoelectric layer 14 and the surface of the third dielectric film 17C in a portion where the second IDT electrode 11B is not provided.

In the first to the third preferred embodiments, the first dielectric film 17A and the second dielectric film 17B are trimmed in the frequency adjustment. Meanwhile, in the present preferred embodiment, the first dielectric film 17A and the third dielectric film 17C are trimmed in the frequency adjustment. As illustrated in FIG. 8, since each of the cavity 43a and the cavity 43b is defined by the through-hole, the first dielectric film 17A and the third dielectric film 17C each may be suitably trimmed.

In the present preferred embodiment as well, $ts1/tp1<(ts2+ts3)/tp2$ is satisfied. Accordingly, variation in the trimming amount differences $\Delta ts$ of the frequency adjustment films between the acoustic wave resonators may be reduced, and thus the frequency variation may be reduced.

The inventor of preferred embodiments of the present invention has discovered that the ratios $\Delta ts/\Delta tp$ may be made close to each other between the first resonator and the second resonator even when $ts1/tp1<(ts2+ts3)/tp2$ is not satisfied. Specifically, even when the dielectric films to be trimmed are made of different types of dielectrics and $ts1/tp1>(ts2+ts3)/tp2$ is satisfied, the ratios $\Delta ts/\Delta tp$ may be made close to each other between the acoustic wave resonators above. An example of this will be illustrated and described below as a reference example.

Figure 9:
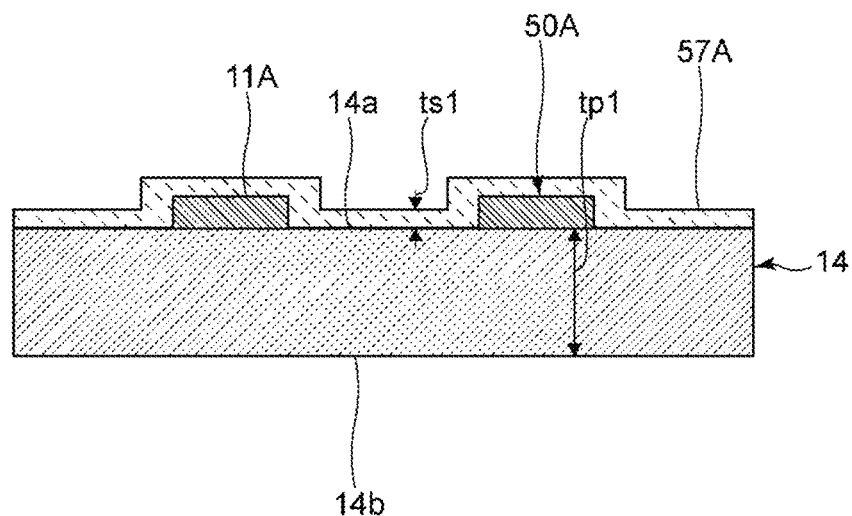
FIG. 9 is a schematic elevational sectional view of a first resonator in a reference example illustrating the vicinity of one pair of electrode fingers.
Figure 10:
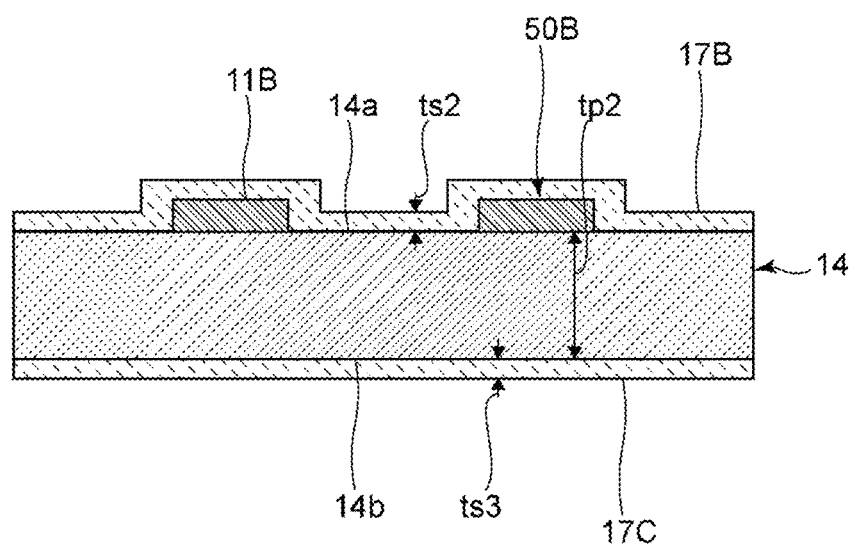
FIG. 10 is a schematic elevational sectional view of a second resonator in the reference example illustrating the vicinity of one pair of electrode fingers.

FIG. 9 is a schematic elevational sectional view of a first resonator in a reference example illustrating the vicinity of one pair of electrode fingers. FIG. 10 is a schematic elevational sectional view of a second resonator in the reference example illustrating the vicinity of one pair of electrode fingers.

As illustrated in FIG. 9 and FIG. 10, the reference example is different from the first preferred embodiment in that a first dielectric film 57A in a first resonator 50A and the second dielectric film 17B in a second resonator 50B are made of different types of dielectrics. The reference example is also different from the first preferred embodiment in that $ts1/tp1>(ts2+ts3)/tp2$ is satisfied. Except for the point above, the acoustic wave device of the reference example has the same or substantially the same configuration as that of the acoustic wave device 10 of the first preferred embodiment.

More specifically, the first dielectric film 57A in the reference example is made of SiN, for example. The second dielectric film 17B and the third dielectric film 17C are each made of $SiO_2$, for example.

Figure 11:
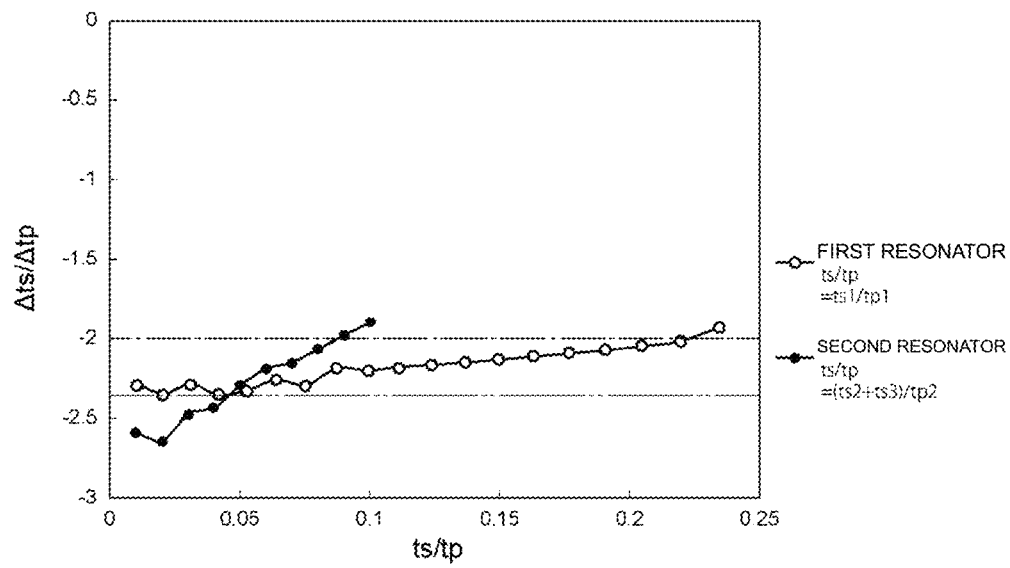
FIG. 11 is a graph illustrating a relationship between a ratio ts/tp and a ratio Δts/Δtp in the first resonator and in the second resonator in the reference example.

FIG. 11 is a graph illustrating a relationship between the ratio ts/tp and the ratio $\Delta ts/\Delta tp$ in the first resonator and in the second resonator in the reference example.

As illustrated in FIG. 11, in the present preferred embodiment, the ratios $\Delta ts/\Delta tp$ in the first resonator 50A and in the second resonator 50B is reversed in magnitude relationship with a ratio ts/tp of, for example about 0.045 as a boundary. As indicated by a dashed-and-dotted line in FIG. 11, the ratio $\Delta ts/\Delta tp$ in the first resonator 50A is equal to the ratio $\Delta ts/\Delta tp$ in the second resonator 50B. By making $ts1/tp1>(ts2+ts3)/tp2$, the ratios $\Delta ts/\Delta tp$ of both may be made equal or substantially equal to each other. As an example illustrated by a dashed-and-double-dotted line in FIG. 11, even when $ts1/tp1<(ts2+ts3)/tp2$, the ratios $\Delta ts/\Delta tp$ of both may be made equal or substantially equal to each other.

In the reference example, acoustic impedance of the second dielectric film 17B is higher than acoustic impedance of the first dielectric film 57A. In the case above, when $ts1/tp1>(ts2+ts3)/tp2$ is satisfied, as illustrated in FIG. 11, the ratios $\Delta ts/\Delta tp$ of the first resonator 50A and the second resonator 50B may be made close to each other. In the reference example, the resonant frequency of the first resonator may be lower than the resonant frequency of the second resonator.

An acoustic wave device according to a preferred embodiment of the present invention may be a filter device. Hereinafter, an example of an acoustic wave device as a filter device will be described.

Figure 12:
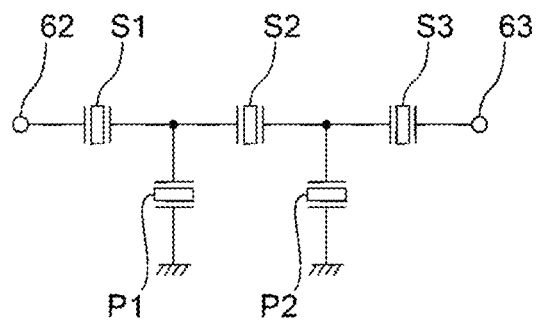
FIG. 12 is a circuit diagram of an acoustic wave device according to a fifth preferred embodiment of the present invention.

FIG. 12 is a circuit diagram of an acoustic wave device according to a fifth preferred embodiment of the present invention.

An acoustic wave device 61 is a ladder filter, for example. The acoustic wave device 61 includes a first signal terminal 62, a second signal terminal 63, a plurality of series-arm resonators, and a plurality of parallel-arm resonators. Each of the first signal terminal 62 and the second signal terminal 63 may be structured as an electrode pad, or may be structured as a wiring line, for example. In the present preferred embodiment, the first signal terminal 62 is an antenna terminal. The antenna terminal is connected to an antenna.

The plurality of series-arm resonators of the acoustic wave device 61 are, specifically, series-arm resonators S1, S2, and S3. The plurality of parallel-arm resonators are, specifically, parallel-arm resonators P1 and P2. In the present preferred embodiment, the series-arm resonator S1 is the first resonator. The parallel-arm resonator P1 is the second resonator.

The series-arm resonators S1, S2, and S3 are connected in series between the first signal terminal 62 and the second signal terminal 63. The parallel-arm resonator P1 is connected between a ground electric potential and a connection point of the series-arm resonator S1 and the series-arm resonator S2. The parallel-arm resonator P2 is connected between the ground electric potential and a connection point of the series-arm resonator S2 and the series-arm resonator S3. Note that the circuit configuration of the acoustic wave device 61 is not limited to the above. The acoustic wave device 61 needs to include a first resonator as a series-arm resonator and a second resonator as a parallel-arm resonator.

The acoustic wave device 61 includes the first resonator and the second resonator. Accordingly, similar to the first preferred embodiment and the like, variation in the trimming amount differences of the frequency adjustment films between the acoustic wave resonators may be reduced, and thus the frequency variation may be reduced.

The acoustic wave device 61 may include the plurality of first resonators according or the plurality of second resonators. For example, at least one of the plurality of series-arm resonators may be the first resonator, and at least one of the plurality of parallel-arm resonators may be the second resonator.

When an acoustic wave device according to a preferred embodiment of the present invention is a filter device, the acoustic wave device may include the first resonator as a parallel-arm resonator and the second resonator as a series-arm resonator. In the case above, referring to FIG. 12, at least one of the parallel-arm resonators P1 and P2, as the plurality of parallel-arm resonators, is the first resonator. At least one of the series-arm resonators S1, S2, and S3, as the plurality of series-arm resonators, is the second resonator.

Hereinafter, a thickness-shear mode will be described in detail. The first IDT electrode 11A and the second IDT electrode 11B each include an IDT electrode to be described later. A support member in the following example corresponds to the support substrate.

Figure 13A:
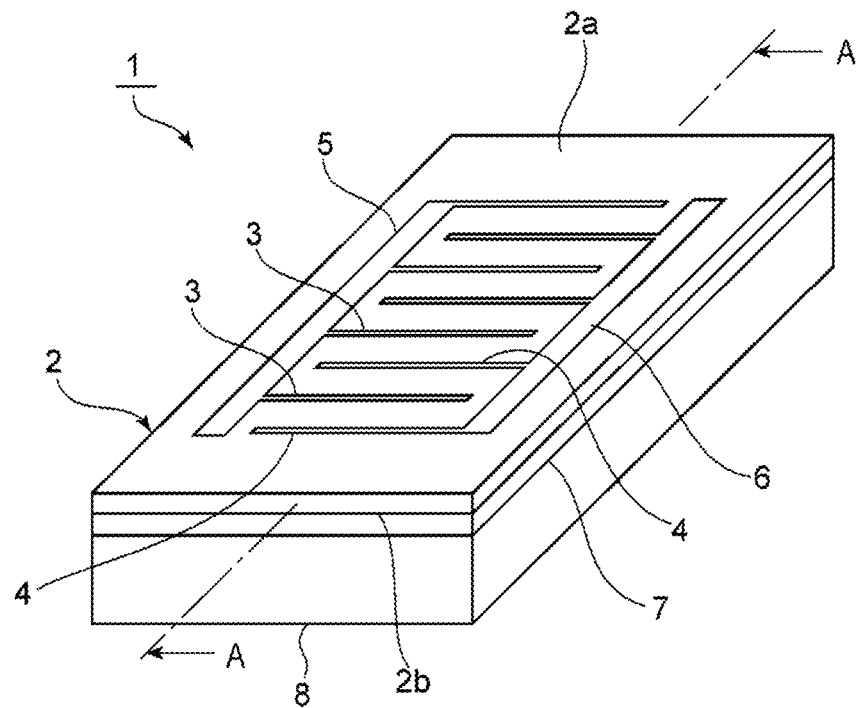
FIG. 13A is a schematic perspective view of an acoustic wave device using a bulk wave in a thickness-shear mode illustrating an appearance thereof.
Figure 13B:
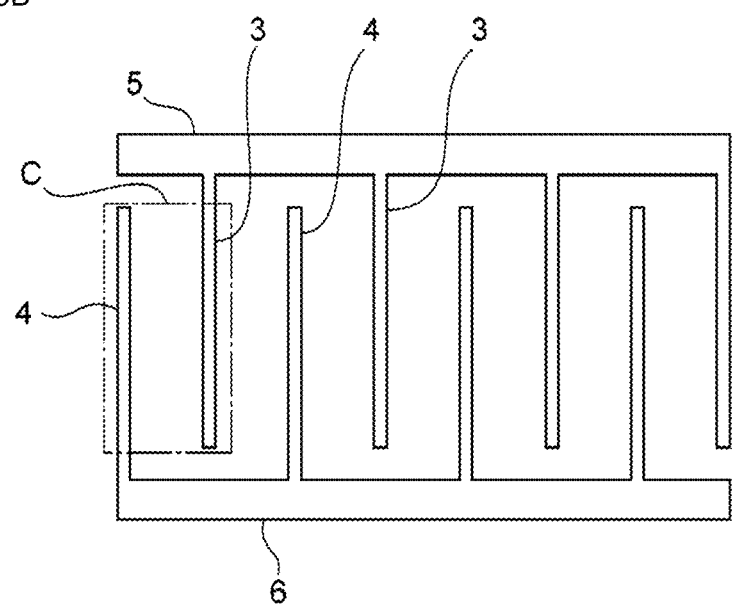
FIG. 13B is a plan view of an electrode structure on a piezoelectric layer.
Figure 14:
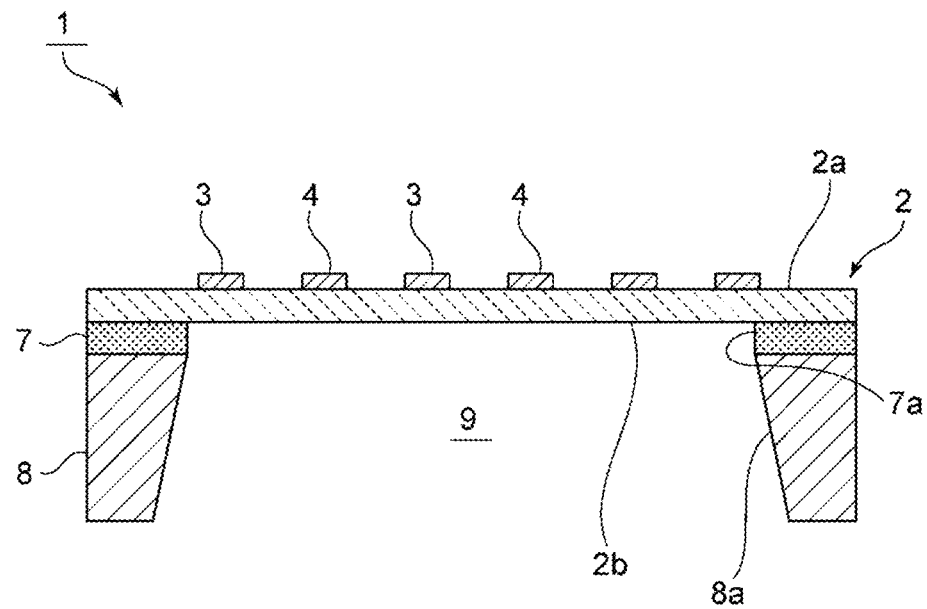
FIG. 14 is a sectional view of a portion taken along a line A-A in FIG. 13A.

FIG. 13A is a schematic perspective view of an acoustic wave device using a bulk wave in a thickness-shear mode illustrating an appearance thereof, and FIG. 13B is a plan view of an electrode structure on a piezoelectric layer. FIG. 14 is a sectional view of a portion taken along a line A-A in FIG. 13A.

An acoustic wave device 1 includes a piezoelectric layer 2 made of $LiNbO_3$, for example. The piezoelectric layer 2 may be made of $LiTaO_3$, for example. A cut angle of each of the $LiNbO_3$ and the $LiTaO_3$ is a Z-cut, but may be a rotated Y-cut or an X-cut. A thickness of the piezoelectric layer 2 is not particularly limited, but is preferably, for example, about 40 nm or more and about 1000 nm or less, and more preferably about 50 nm or more and about 1000 nm or less in order to effectively excite a thickness-shear mode. The piezoelectric layer 2 includes a first main surface 2a and a second main surface 2b opposed to each other. Electrodes 3 and 4 are provided on the first main surface 2a. Here, the electrode 3 is an example of the "first electrode", and the electrode 4 is an example of the "second electrode". In FIGS. 13A and 13B, a plurality of electrodes 3 are connected to a first busbar 5. A plurality of electrodes 4 are connected to a second busbar 6. The plurality of electrodes 3 and the plurality of electrodes 4 are interdigitated with each other. The electrode 3 and the electrode 4 each have a rectangular or substantially rectangular shape and a length direction. The electrode 3 and the adjacent electrode 4 face each other in a direction orthogonal or substantially orthogonal to the length direction. The length direction of the electrodes 3 and 4, and the direction orthogonal or substantially orthogonal to the length direction of the electrodes 3 and 4 are both directions intersecting with a thickness direction of the piezoelectric layer 2. Thus, it can be said as well that the electrode 3 and the adjacent electrode 4 face each other in the direction intersecting with the thickness direction of the piezoelectric layer 2. Further, the length direction of the electrodes 3 and 4 may be exchanged with the direction orthogonal or substantially orthogonal to the length direction of the electrodes 3 and 4 illustrated in FIGS. 13A and 13B. That is, in FIGS. 13A and 13B, the electrodes 3 and 4 may be extended in a direction in which the first busbar 5 and the second busbar 6 extend. In the case above, the first busbar 5 and the second busbar 6 each extend in the direction in which the electrodes 3 and 4 each extend in FIGS. 13A and 13B. A structure of one pair in which the electrode 3 connected to one electric potential and the electrode 4 connected to the other electric potential are adjacent to each other is provided, and a plurality of structures of the one pair is provided in the direction orthogonal or substantially orthogonal to the length direction of the electrodes 3 and 4. Here, the electrode 3 and the electrode 4 being adjacent to each other refers not to a case that the electrode 3 and the electrode 4 are disposed to be in direct contact with each other, but to a case that the electrode 3 and the electrode 4 are disposed with a gap therebetween. Further, when the electrode 3 and the electrode 4 are adjacent to each other, an electrode connected to a hot electrode or a ground electrode, including other electrodes 3 and 4, is not disposed between the electrode 3 and the electrode 4. The number of pairs need not be integer pairs, but may be 1.5 pairs, 2.5 pairs, or the like. A center-to-center distance of the electrodes 3 and 4, that is, a pitch is preferably in a range of, for example, about 1 μm or more and about 10 μm or less. Further, a width of each of the electrodes 3 and 4, that is, a measurement of each of the electrodes 3 and 4 in a facing direction is preferably in a range of, for example, about 50 nm or more and about 1000 nm or less, and more preferably in a range of about 150 nm or more and about 1000 nm or less. The center-to-center distance between the electrodes 3 and 4 is a distance between a center of a measurement (width measurement) of the electrode 3 in the direction orthogonal to the length direction of the electrode 3, and a center of a measurement (width measurement) of the electrode 4 in the direction orthogonal to the length direction of the electrode 4.

Since the acoustic wave device 1 uses a Z-cut piezoelectric layer, the direction orthogonal or substantially orthogonal to the length direction of the electrodes 3 and 4 is orthogonal or substantially orthogonal to a polarization direction of the piezoelectric layer 2. This is not the case when a piezoelectric body with another cut angle is used as the piezoelectric layer 2. Here, "orthogonal" is not limited to strictly orthogonal but may be substantially orthogonal (angle formed by the direction orthogonal to the length direction of the electrodes 3 and 4 and the polarization direction is within a range of about 90°±10°, for example).

A support member 8 is laminated on a side of the second main surface 2b of the piezoelectric layer 2 with an insulation layer 7 interposed therebetween. The insulation layer 7 and the support member 8 each have a frame shape, and include through-holes 7a and 8a as illustrated in FIG. 14. As a result, a cavity 9 is provided. The cavity 9 is provided so as not to interfere with a vibration of the piezoelectric layer 2 in an excitation region C. Accordingly, the support member 8 is laminated on the second main surface 2b with the insulation layer 7 interposed therebetween at a position not overlapping a portion where at least one pair of electrodes 3 and 4 is provided. An absence of the insulation layer 7 is acceptable. Accordingly, the support member 8 may directly or indirectly be laminated on the second main surface 2b of the piezoelectric layer 2.

The insulation layer 7 is made of silicon oxide, for example. In addition to silicon oxide, an appropriate insulation material such as silicon oxynitride or alumina may be used, for example. The support member 8 is made of Si, for example. A plane orientation of a surface of Si on a side of the piezoelectric layer 2 may be (100), (110), or (111). It is preferable that Si defining the support member 8 has a high resistance of, for example, a resistivity of about 4 kΩcm or more. The support member 8 may also be provided using an appropriate insulation material or semiconductor material.

Examples of the material of the support member 8 include piezoelectric materials such as aluminum oxide, lithium tantalate, lithium niobate, and quartz crystal; various ceramics such as alumina, magnesia, sapphire, silicon nitride, aluminum nitride, silicon carbide, zirconia, cordierite, mullite, steatite, and forsterite; dielectrics such as diamond and glass; and semiconductors such as gallium nitride.

The plurality of electrodes 3 and 4, the first busbar 5, and the second busbar 6 are each made of an appropriate metal or alloy such as, for example, Al or an AlCu alloy. In the present preferred embodiment, the electrodes 3 and 4, the first busbar 5, and the second busbar 6 each have, for example, a structure in which an Al film is laminated on a Ti film. A close contact layer other than the Ti film may be used.

At the time of driving, an AC voltage is applied between the plurality of electrodes 3 and the plurality of electrodes 4. More specifically, an AC voltage is applied between the first busbar 5 and the second busbar 6. As a result, resonance characteristics using a bulk wave in a thickness-shear mode excited in the piezoelectric layer 2 may be obtained. In the acoustic wave device 1, when the thickness of the piezoelectric layer 2 is represented by d and the center-to-center distance between any adjacent electrodes 3 and 4 out of the plurality of pairs of electrodes 3 and 4 is represented by p, d/p is equal to or less than about 0.5. Thus, the bulk wave in the thickness-shear mode is effectively excited, and preferable resonance characteristics may be obtained. More preferably, d/p is equal to or less than about 0.24, in which case even more preferable resonance characteristics may be obtained.

Since the acoustic wave device 1 has the configuration described above, even when the number of pairs of the electrodes 3 and 4 is decreased in order to reduce in size, a Q factor is less likely to lower. This is because a propagation loss is small even when the number of electrode fingers in each of reflectors on both sides is decreased. Further, using a bulk wave in a thickness-shear mode makes it possible to decrease the number of the electrode fingers. The difference between a Lamb wave used in an acoustic wave device and the bulk wave in a thickness-shear mode above will be described with reference to FIGS. 15A and 15B.

Figure 15A:
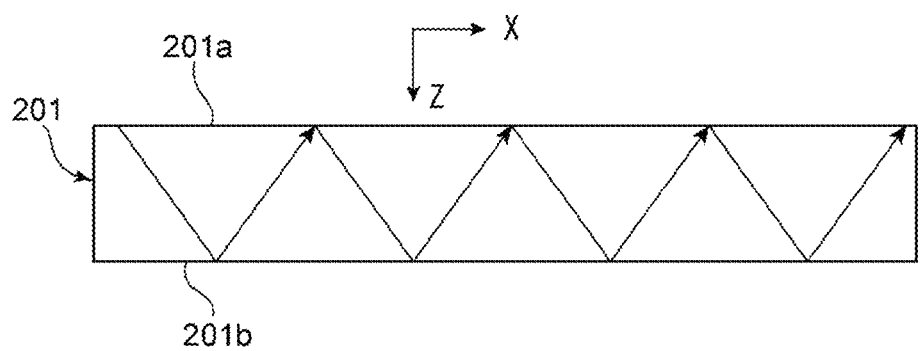
FIG. 15A is a schematic elevational sectional view of a piezoelectric layer of an acoustic wave device for explaining a Lamb wave propagating therethrough.

FIG. 15A is a schematic elevational sectional view for explaining a Lamb wave propagating through a piezoelectric film of an acoustic wave device as described in Japanese Unexamined Patent Application Publication No. 2012-257019. A wave propagates through a piezoelectric film 201 as indicated by an arrow. In the piezoelectric film 201, a first main surface 201a and a second main surface 201b are opposed to each other, and a thickness direction connecting the first main surface 201a and the second main surface 201b is a Z-direction. An X-direction is a direction in which the electrode fingers of the IDT electrode are arranged side by side. As illustrated in FIG. 15A, in a Lamb wave, a wave propagates in the X-direction. Although the piezoelectric film 201 vibrates as a whole because of a plate wave, since the wave propagates in the X-direction, reflectors are disposed on both sides to obtain resonance characteristics. Therefore, a propagation loss of a wave occurs, and the Q factor lowers when the size is reduced, that is, when the number of pairs of electrode fingers is decreased.

Figure 15B:
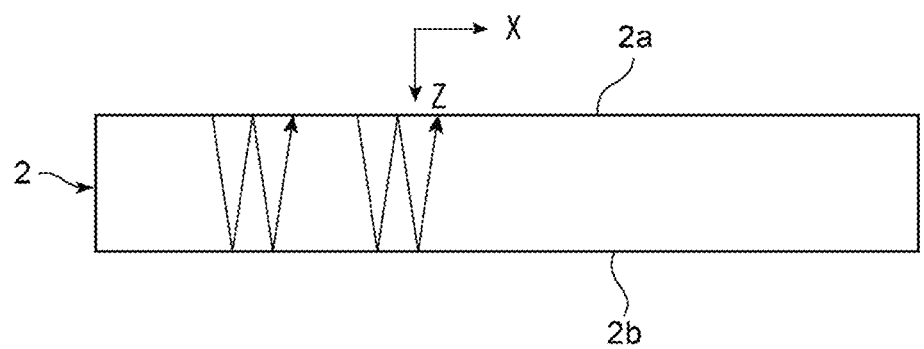
FIG. 15B is a schematic elevational sectional view of a piezoelectric layer of an acoustic wave device for explaining a bulk wave in a thickness-shear mode propagating therethrough.

In contrast, as illustrated in FIG. 15B, in the acoustic wave device 1, since vibration displacement is in a thickness-shear direction, a wave propagates substantially in a direction connecting the first main surface 2a and the second main surface 2b of the piezoelectric layer 2, that is, in the Z-direction, and resonates. That is, an X-direction component of the wave is remarkably smaller than a Z-direction component. Since resonance characteristics are obtained by the propagation of the wave in the Z-direction, a propagation loss hardly occurs even when the number of electrode fingers of the reflector is decreased. Furthermore, even when the number of pairs of the electrodes 3 and 4 is decreased in order to further reduce in size, the Q factor is less likely to lower.

Figure 16:
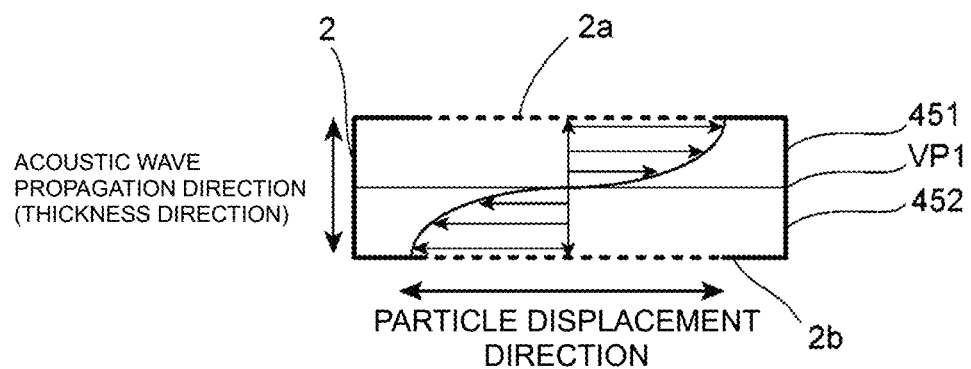
FIG. 16 is a diagram illustrating an amplitude direction of a bulk wave in a thickness-shear mode.

As illustrated in FIG. 16, an amplitude direction of a bulk wave in a thickness-shear mode is opposite in a first region 451 and in a second region 452, in which the first region 451 and the second region 452 are included in the excitation region C of the piezoelectric layer 2. In FIG. 16, there is schematically illustrated a bulk wave when a voltage, making the electrode 4 have a higher electric potential than the electrode 3, is applied between the electrode 3 and the electrode 4. The first region 451 is a region of the excitation region C between the first main surface 2a and a virtual plane VP1 that is orthogonal or substantially orthogonal to the thickness direction of the piezoelectric layer 2 and divides the piezoelectric layer 2 into two. The second region 452 is a region of the excitation region C between the virtual plane VP1 and the second main surface 2b.

As described above, in the acoustic wave device 1, at least one pair of electrodes including the electrodes 3 and 4 is provided. However, since a wave does not propagate in the X-direction, the number of pairs of electrodes of the electrodes 3 and 4 need not be plural. That is, at least one pair of electrodes is needed.

For example, the electrode 3 is an electrode connected to a hot electric potential, and the electrode 4 is an electrode connected to the ground electric potential. The electrode 3 may be connected to the ground electric potential and the electrode 4 may be connected to the hot electric potential. In the present preferred embodiment, as described above, an electrode in at least one pair of electrodes is connected to the hot electric potential or to the ground electric potential, and a floating electrode is not provided.

Figure 17:
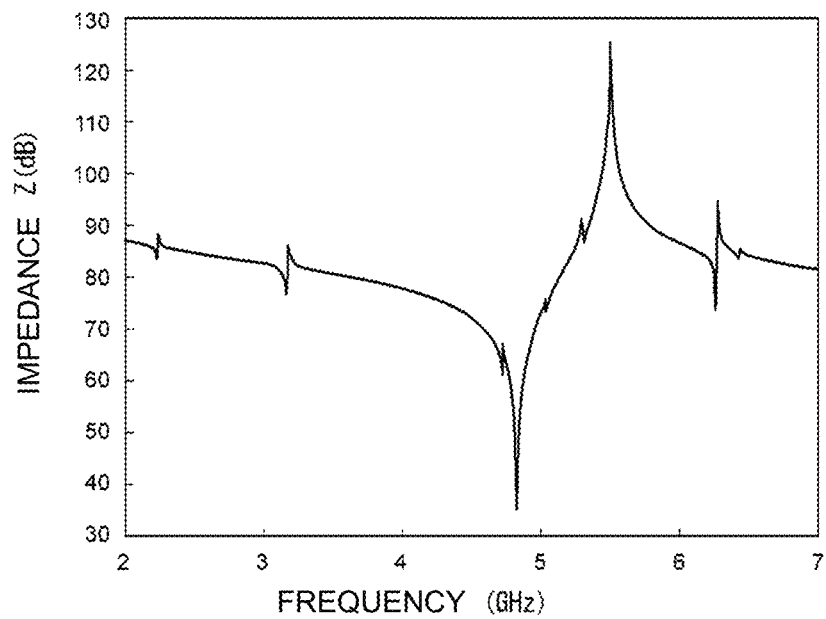
FIG. 17 is a graph illustrating resonance characteristics of an acoustic wave device using a bulk wave in a thickness-shear mode.

FIG. 17 is a graph illustrating resonance characteristics of the acoustic wave device illustrated in FIG. 14. Design parameters of the acoustic wave device 1 having the resonance characteristics are as follows.

Piezoelectric layer 2: LiNbO$_3$ of Euler angles (0°, 0°, 90°), thickness=about 400 nm When viewed in the direction orthogonal to the length direction of the electrodes 3 and 4, a region where the electrodes 3 and 4 overlap each other, that is, the excitation region C has the design parameters as follows; length=about 40 μm, the number of pairs of the electrodes 3 and 4=21 pairs, distance between centers of the electrodes=about 3 μm, width of each of the electrodes 3 and 4=about 500 nm, d/p=about 0.133.

Insulation layer 7: silicon oxide film of 1 μm in thickness
Support member 8: Si A length of the excitation region C is a measurement of the excitation region C along the length direction of the electrodes 3 and 4.

In the present preferred embodiment, inter-electrode distances of the electrode pairs including the electrodes 3 and 4 are all made equal or substantially equal in the plurality of pairs. That is, the electrodes 3 and the electrodes 4 are disposed at equal or substantially equal pitches.

As is clear from FIG. 17, good resonance characteristics with a fractional bandwidth of, for example, about 12.5% are obtained even though no reflector is provided.

When the thickness of the piezoelectric layer 2 is represented by d and the center-to-center distance of the electrodes 3 and 4 is represented by p, d/p is preferably, for example, about 0.5 or less and more preferably about 0.24 or less in the present preferred embodiment as described before. This will be described with reference to FIG. 18.

Figure 18:
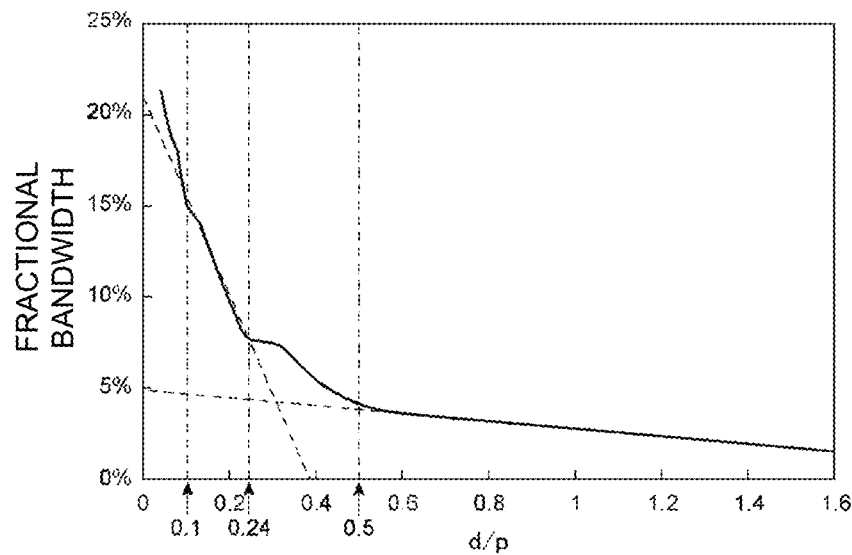
FIG. 18 is a graph illustrating a relationship between d/p and a fractional bandwidth as a resonator, when a center-to-center distance of adjacent electrodes is represented by p and a thickness of the piezoelectric layer is represented by d.

A plurality of acoustic wave devices is obtained in the same or substantially the same manner as the acoustic wave device having the resonance characteristics illustrated in FIG. 17, but d/p is changed. FIG. 18 is a graph illustrating a relationship between d/p and a fractional bandwidth as a resonator of an acoustic wave device.

As is clear from FIG. 18, for example, when d/p>about 0.5, the fractional bandwidth is less than about 5% even when d/p is adjusted. In contrast, in a case of d/p about 0.5, by changing d/p within the range, the fractional bandwidth may be made about 5% or more, that is, a resonator having a high coupling coefficient may be formed. When d/p is about 0.24 or less, the fractional bandwidth may be increased to about 7% or more. Further, when d/p is adjusted within this range, a resonator having a still wider fractional bandwidth may be obtained, and a resonator having a still higher coupling coefficient may be realized. Accordingly, it is understood that by setting d/p to about 0.5 or less, for example, a resonator having a high coupling coefficient using a bulk wave in a thickness-shear mode may be formed.

Figure 19:
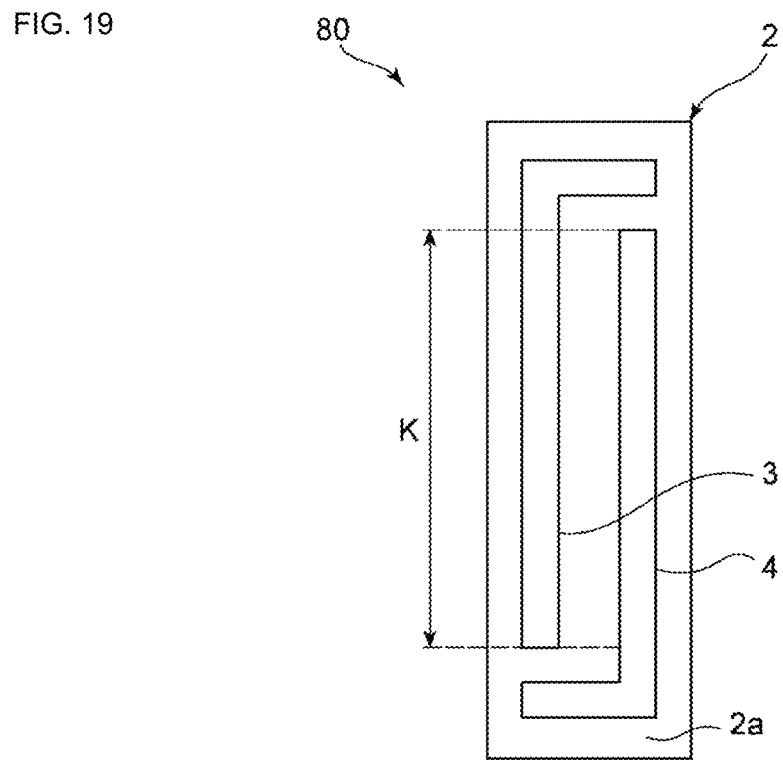
FIG. 19 is a plan view of an acoustic wave device using a bulk wave in a thickness-shear mode.

FIG. 19 is a plan view of an acoustic wave device using a bulk wave in a thickness-shear mode. In an acoustic wave device one pair of electrodes including the electrodes 3 and 4 is provided on the first main surface 2a of piezoelectric layer 2. K in FIG. 19 is an overlap width. As described above, in an acoustic wave device according to a preferred embodiment of the present invention, the number of pairs of electrodes may be one pair. In the case above as well, when the d/p is about 0.5 or less, for example, a bulk wave in a thickness-shear mode may effectively be excited.

Figure 20:
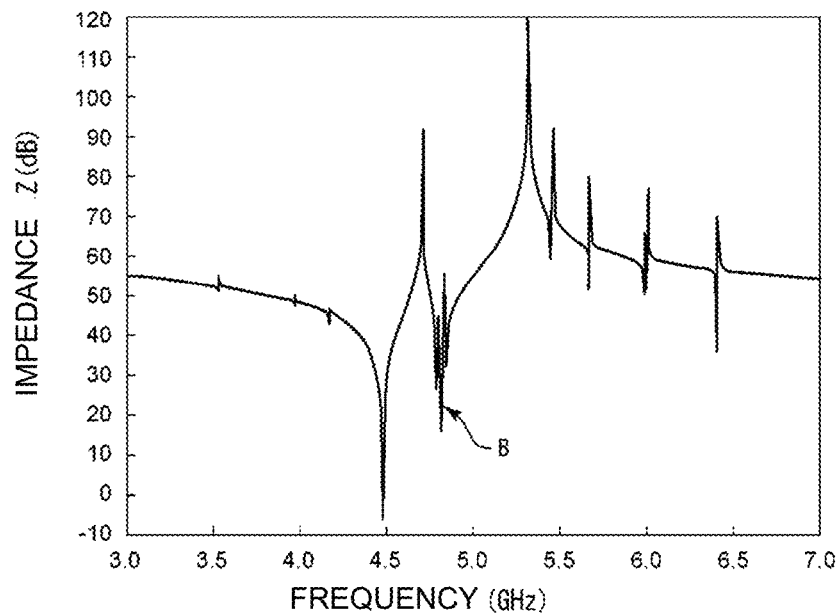
FIG. 20 is a graph illustrating resonance characteristics of an acoustic wave device of a reference example in which a spurious component appears.

In the acoustic wave device 1, it is preferable that MR about 1.75 (d/p)+0.075 is satisfied, in which MR is a metallization ratio of the adjacent electrodes 3 and 4 relative to the excitation region C. The excitation region C is a region in which, in the plurality of electrodes 3 and 4, any adjacent electrodes 3 and 4 overlap each other when viewed in the facing direction. In the case above, a spurious component may effectively be lowered. This will be described with reference to FIG. 20 and FIG. 21. FIG. 20 is a reference graph illustrating an example of resonance characteristics of the acoustic wave device 1. A spurious component indicated by an arrow B appears between a resonant frequency and an anti-resonant frequency. Note that d/p=about 0.08 and the LiNbO$_3$ Euler angles were (0°, 0°, 90°). The metallization ratio MR was set to about 0.35.

The metallization ratio MR will be explained with reference to FIG. 13B. When attention is paid to one pair of the electrodes 3 and 4 in the electrode structure of FIG. 13B, it is assumed that only the one pair of the electrodes 3 and 4 is provided. In the case above, a portion surrounded by a dashed-and-dotted line is the excitation region C. The excitation region C is a region as follows when the electrodes 3 and 4 are viewed in the direction orthogonal or substantially orthogonal to the length direction of the electrodes 3 and 4, that is, in the facing direction. The excitation region C includes a region of the electrode 3 where the electrode 3 overlaps the electrode 4, a region of the electrode 4 where the electrode 4 overlaps the electrode 3, and a region where the electrode 3 and the electrode 4 overlap each other in a region between the electrode 3 and the electrode 4. An area of the electrodes 3 and 4 in the excitation region C relative to an area of the excitation region C is the metallization ratio MR. That is, the metallization ratio MR is a ratio of the area of the metallization portion to the area of the excitation region C.

When a plurality of pairs of electrodes is provided, MR may be defined as the ratio of the metallization portion included in the entire excitation region to the sum of the areas of the excitation regions.

Figure 21:
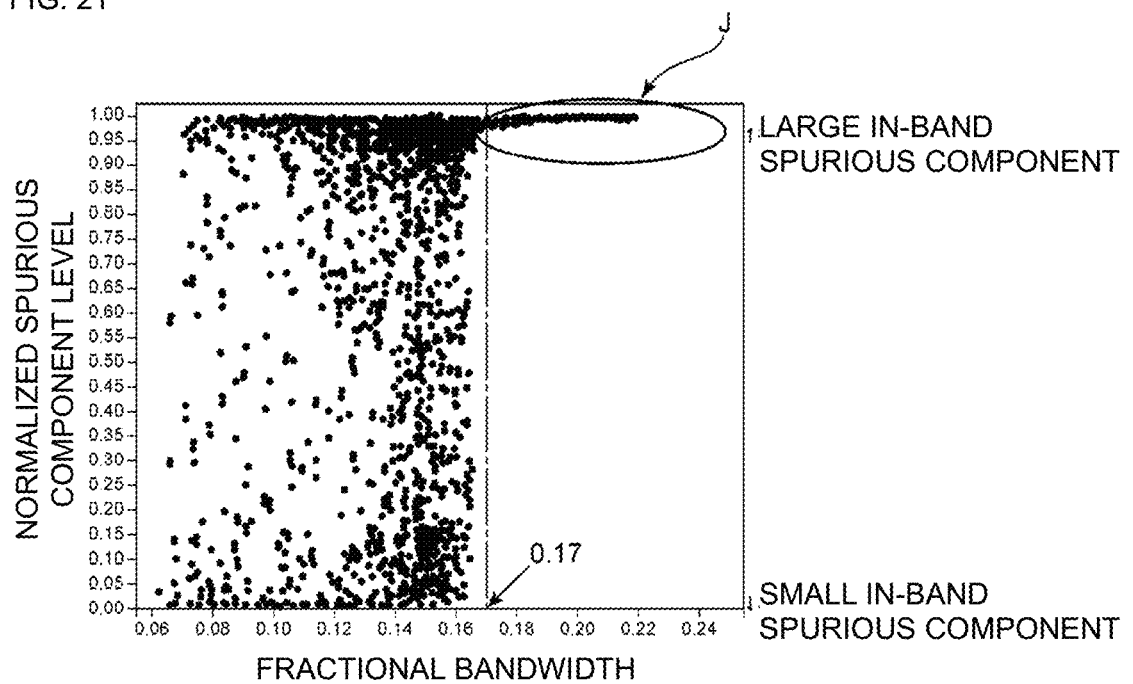
FIG. 21 is a chart illustrating a relationship between a fractional bandwidth and a phase rotation amount of impedance of a spurious component normalized by 180 degrees as a spurious component level.

FIG. 21 is a chart illustrating a relationship between a fractional bandwidth, when a large number of acoustic wave resonators are configured according to the present preferred embodiment, and a spurious component level being a phase rotation amount of impedance of a spurious component normalized by about 180 degrees. The fractional bandwidth was adjusted by variously changing a film thickness of the piezoelectric layer and the measurement of the electrode. Further, although FIG. 21 illustrates a result in a case of using the piezoelectric layer formed of the Z-cut LiNbO$_3$, the same or substantially the same tendency is obtained even in a case of using the piezoelectric layer with another cut angle.

In a region surrounded by an ellipse J in FIG. 21, the spurious component is as large as about 1.0. As is clear from FIG. 21, when the fractional bandwidth exceeds about 0.17, that is, when the fractional bandwidth exceeds about 17%, a large spurious component having a spurious level of about 1 or more appears in the pass band even when the parameters regulating the fractional bandwidth are changed. That is, as in the resonance characteristics illustrated in FIG. 20, the large spurious component indicated by an arrow B appears within a band. Therefore, the fractional bandwidth is preferably about 17% or less, for example. In the case above, a spurious component may be lowered by adjusting the film thickness of the piezoelectric layer 2, the measurements of the electrodes 3 and 4, and the like.

Figure 22:
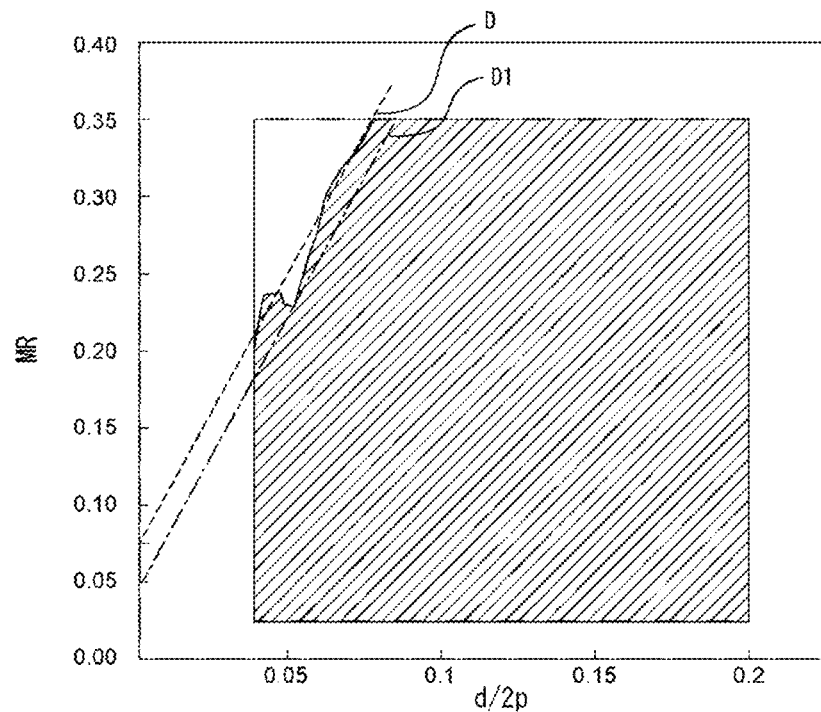
FIG. 22 is a chart illustrating a relationship between d/2p and a metallization ratio MR.

FIG. 22 is a chart illustrating a relationship between d/2p, a metallization ratio MR, and a fractional bandwidth. In the acoustic wave device described above, various acoustic wave devices that are different in d/2p and MR were provided, and the fractional bandwidth was measured. A hatched portion on a right side of a broken line D in FIG. 22 is a region where the fractional bandwidth is about 17% or less. A boundary between the hatched region and the non-hatched region is represented by MR=about 3.5 (d/2p)+0.075. That is, MR=about 1.75 (d/p)+0.075 is satisfied. Accordingly, for example, MR about 1.75 (d/p)+0.075 is preferably satisfied. In the case above, the fractional bandwidth is easily made about 17% or less. More preferably, it is a region on the right side of a dashed-and-dotted line D1 in FIG. 22 indicating MR=about 3.5 (d/2p)+0.05. That is, when MR about 1.75 (d/p)+0.05 is satisfied, the fractional bandwidth may reliably be made about 17% or less.

Figure 23:
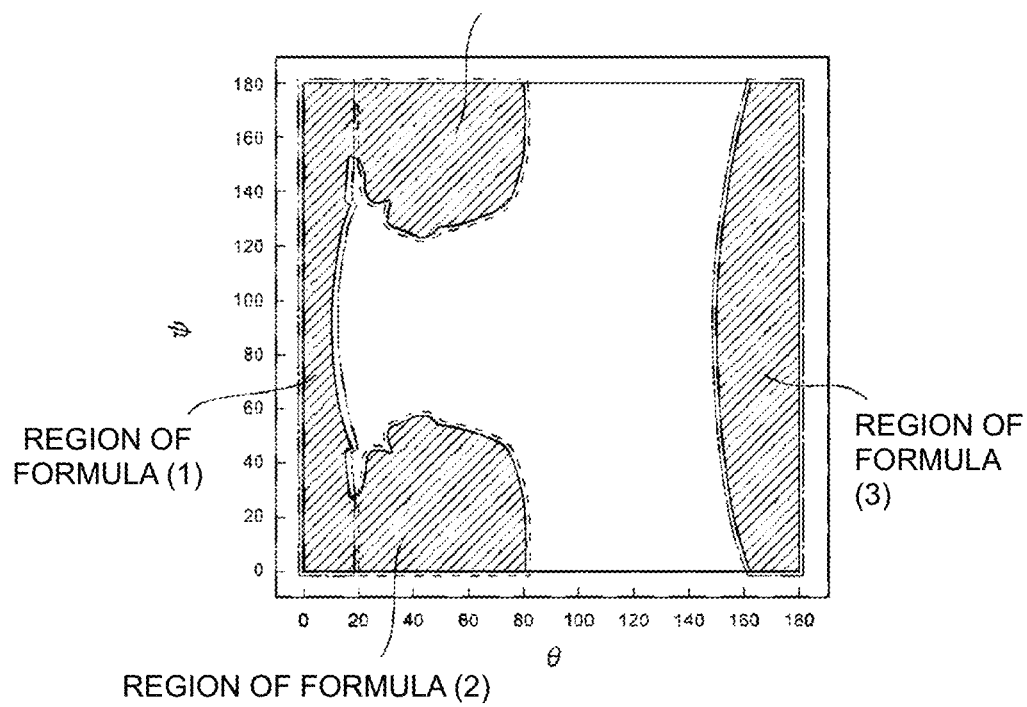
FIG. 23 is a chart illustrating a map of the fractional bandwidth relative to Euler angles (0°, θ, ψ) of $LiNbO_3$ when d/p is made as close to 0 as possible.

FIG. 23 is a chart illustrating a map of the fractional bandwidth relative to Euler angles (0°, θ, ψ) of LiNbO$_3$ when d/p is made as close to 0 as possible. A hatched portion in FIG. 23 is a region in which a fractional bandwidth of at least about 5% or more is obtained, and when the range of the region is approximated, the range is represented by the following formula (1), formula (2), and formula (3).

(0°±10°,0° to 20°,any ψ)   Formula (1)

(0°±10°,20° to 80°,0° to 60°(1−(θ−50)$^2$/900)$^{1/2}$) or (0°±10°,20° to 80°,[180°−60°(1−(θ−50)$^2$/900)$^{1/2}$] to 180°)   Formula (2)

(0°±10°,[180°−30°(1−(ψ−90)$^2$/8100)$^{1/2}$] to 180°,any ψ)   Formula (3)

Accordingly, in a case that Euler angles are in a range of the above formula (1), formula (2) or formula (3), the fractional bandwidth may be sufficiently widened, and it is preferable. The same applies to a case that the piezoelectric layer 2 is a lithium tantalate layer, for example.

In each of the acoustic wave devices according to the first preferred embodiment to the fifth preferred embodiment using a bulk wave in a thickness-shear mode, for example, d/p is preferably equal to or less than about 0.5, and more preferably equal to or less than about 0.24 in each of the first resonator and the second resonator as described above. As a result, still more preferable resonance characteristics may be obtained. Furthermore, in each of the acoustic wave devices according to the first preferred embodiment to the fifth preferred embodiment using a bulk wave in a thickness-shear mode, for example, it is preferable that MR about 1.75 (d/p)+0.075 is satisfied in each of the first resonator and the second resonator as described above. In the case above, the spurious component may more reliably be lowered.

The first functional electrode and the second functional electrode, in each of the acoustic wave devices according to the first preferred embodiment to the fifth preferred embodiment using a bulk wave in a thickness-shear mode, may be a functional electrode including one pair of electrodes illustrated in FIG. 19.

The piezoelectric layer, in each of the acoustic wave devices according to the first preferred embodiment to the fifth preferred embodiment using a bulk wave in a thickness-shear mode, is preferably, for example, a lithium niobate layer or a lithium tantalate layer. Euler angles (φ, θ, ψ) of lithium niobate or lithium tantalate constituting the piezoelectric layer are preferably in a range of the above formula (1), formula (2) or formula (3). In the case above, a fractional bandwidth may sufficiently be widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
  a first resonator including:
    a piezoelectric substrate including a piezoelectric layer including a first main surface and a second main surface opposed to each other;
    a first functional electrode on one of the first main surface and the second main surface; and
    a first dielectric film on the one of the first main surface and the second main surface on which the first functional electrode is provided;
  a second resonator sharing the piezoelectric layer with the first resonator, and including:
    a second functional electrode on one of the first main surface and the second main surface;
    a second dielectric film on the first main surface; and
    a third dielectric film on the second main surface; wherein
  the piezoelectric layer includes a first resonator portion in which the first resonator is provided and a second resonator portion in which the second resonator is provided; and
  when a thickness of the first resonator portion is represented by tp1, a thickness of the second resonator portion is represented by tp2, a thickness of the first dielectric film is represented by ts1, a thickness of the second dielectric film is represented by ts2, and a thickness of the third dielectric film is represented by ts3, ts1/tp1<(ts2+ts3)/tp2 is satisfied.

2. The acoustic wave device according to claim 1, wherein about 1.3×(ts1/tp1)<(ts2+ts3)/tp2 is satisfied.

3. The acoustic wave device according to claim 1, wherein the second dielectric film and the third dielectric film of the second resonator are made of a same type of dielectric.

4. The acoustic wave device according to claim 3, wherein about 0.8×ts2≤ts3≤1.25×ts2 is satisfied.

5. The acoustic wave device according to claim 1, wherein the second dielectric film and the third dielectric film of the second resonator are made of different types of dielectrics.

6. The acoustic wave device according to claim 5, wherein, of the second dielectric film and the third dielectric film of the second resonator, a thickness of a dielectric film with a higher density is smaller than a thickness of a dielectric film with a lower density.

7. The acoustic wave device according to claim 1, wherein the second dielectric film and the third dielectric film of the second resonator are each a silicon oxide film or a silicon nitride film.

8. The acoustic wave device according to claim 1, wherein the acoustic wave device is a ladder filter including:
  the first resonator as a series-arm resonator; and
  the second resonator as a parallel-arm resonator.

9. The acoustic wave device according to claim 1, wherein the acoustic wave device is a ladder filter including:
  the first resonator as a parallel-arm resonator; and the second resonator as a series-arm resonator.

10. The acoustic wave device according to claim 1, wherein the piezoelectric layer is a lithium tantalate layer or a lithium niobate layer.

11. The acoustic wave device according to claim 10, wherein the acoustic wave device is structured to generate a bulk wave in a thickness-shear mode.

12. The acoustic wave device according to claim 11, wherein

Euler angles (ϕ, θ, ψ) of the lithium niobate layer or the lithium tantalate layer as the piezoelectric layer are in a range of formula (1), formula (2), or formula (3):

$$(0°\pm10°, 0° \text{ to } 20°, \text{any } \psi) \quad \text{Formula (1);}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{formula (2); and}$$

$$(0°\pm10°, [180°-30°(1-(\psi-90)^2/8100)^{1/2}] \text{ to } 180°, \text{any } \omega) \quad \text{Formula (3).}$$

13. The acoustic wave device according to claim 10, wherein each of the first functional electrode and the second functional electrode includes at least one pair of electrodes;
the piezoelectric substrate includes a support member;
the piezoelectric layer is on the support member;
a first cavity and a second cavity are provided in the support member, the first cavity overlaps at least a portion of the first functional electrode in plan view, and the second cavity overlaps at least a portion of the second functional electrode in plan view; and
in each of the first resonator and the second resonator, when a thickness of the piezoelectric layer is represented by d and a center-to-center distance between the electrodes of the at least one pair of electrodes that are adjacent to each other is represented by p, d/p is about 0.5 or less.

14. The acoustic wave device according to claim 13, wherein in each of the first functional electrode and the second functional electrode, a region in which the electrodes adjacent to each other overlap each other when viewed from a direction in which the adjacent electrodes face each other is an excitation region; and
in each of the first resonator and the second resonator, when MR is a metallization ratio of the at least one pair of electrodes relative to the excitation region, MR≤about 1.75 (d/p)+0.075 is satisfied.

15. The acoustic wave device according to claim 13, wherein d/p is about 0.24 or less.

16. The acoustic wave device according to claim 1, wherein the support member includes a support substrate and an insulation layer on the support substrate; and
the piezoelectric layer is on the insulation layer.

17. The acoustic wave device according to claim 16, wherein the support substrate includes silicon or aluminum oxide.

18. The acoustic wave device according to claim 16, wherein the insulation layer includes silicon oxide or tantalum pentoxide.

19. The acoustic wave device according to claim 1, wherein the piezoelectric layer is a Z-cut $LiNbO_3$ layer.

* * * * *